(12) United States Patent
Huang et al.

(10) Patent No.: US 9,077,013 B2
(45) Date of Patent: Jul. 7, 2015

(54) BATTERY PACK, HOLSTER, AND EXTENDIBLE PROCESSING AND INTERFACE PLATFORM FOR MOBILE DEVICES

(71) Applicant: Mophie, Inc., Tustin, CA (US)

(72) Inventors: Daniel Huang, Irvine, CA (US); Matthew Brand, Brooklyn, NY (US)

(73) Assignee: Mophie, Inc., Tustin, CA (US)

( * ) Notice: Subject to any disclaimer, the term of this patent is extended or adjusted under 35 U.S.C. 154(b) by 0 days.

(21) Appl. No.: 14/517,428

(22) Filed: Oct. 17, 2014

(65) Prior Publication Data

US 2015/0093623 A1    Apr. 2, 2015

Related U.S. Application Data

(60) Continuation of application No. 12/938,351, filed on Nov. 2, 2010, now Pat. No. 8,971,039, which is a division of application No. 12/357,262, filed on Jan. 21, 2009, now Pat. No. 8,367,235.

(60) Provisional application No. 61/021,897, filed on Jan. 18, 2008.

(51) Int. Cl.
| | |
|---|---|
| *H05K 5/00* | (2006.01) |
| *H05K 7/00* | (2006.01) |
| *G06F 1/16* | (2006.01) |
| *H01M 2/10* | (2006.01) |
| *H04M 1/02* | (2006.01) |

(52) U.S. Cl.
CPC ........ *H01M 2/1022* (2013.01); *H01M 2220/30* (2013.01); *H04M 1/0262* (2013.01); *H04M 1/0254* (2013.01); *G06F 1/1626* (2013.01); *G06F 1/1632* (2013.01); *H04M 1/0283* (2013.01)

(58) Field of Classification Search
CPC .. G06F 1/1632; G06F 1/1626; H04M 1/0262; H04M 1/0283; H04M 1/0254
USPC ......... 361/679.55, 679.56, 679.41; 206/308.3
See application file for complete search history.

(56) References Cited

U.S. PATENT DOCUMENTS

| | | |
|---|---|---|
| D267,795 S | 2/1983 | Mallon |
| 4,479,596 A | 10/1984 | Swanson |
| 4,515,272 A | 5/1985 | Newhouse |
| D284,372 S | 6/1986 | Carpenter |
| 4,951,817 A | 8/1990 | Barletta et al. |

(Continued)

FOREIGN PATENT DOCUMENTS

| | | |
|---|---|---|
| CN | 201252577 Y | 6/2009 |
| CN | 202364273 U | 8/2012 |

(Continued)

OTHER PUBLICATIONS

Reexamination Control No. 90/013,319 including its prosecution history, filed Sep. 18, 2014, Huang et al.

(Continued)

*Primary Examiner* — Anthony Haughton
(74) *Attorney, Agent, or Firm* — Knobbe, Martens, Olson & Bear, LLP

(57) ABSTRACT

Embodiments of this disclosure relate to battery packs and/or holsters and, more particular, to an external battery pack and/or holster for mobile electronic devices.

18 Claims, 25 Drawing Sheets

(56) References Cited

U.S. PATENT DOCUMENTS

| | | |
|---|---|---|
| D312,534 S | 12/1990 | Nelson et al. |
| 5,001,772 A | 3/1991 | Holcomb et al. |
| D322,719 S | 12/1991 | Jayez |
| D327,868 S | 7/1992 | Oka |
| 5,360,108 A | 11/1994 | Alagia |
| 5,368,159 A | 11/1994 | Doria |
| 5,383,091 A | 1/1995 | Snell |
| 5,386,084 A | 1/1995 | Risko |
| 5,508,123 A | 4/1996 | Fan |
| D372,896 S | 8/1996 | Nagele et al. |
| 5,586,002 A | 12/1996 | Notarianni |
| 5,604,050 A | 2/1997 | Brunette et al. |
| 5,610,979 A | 3/1997 | Yu |
| D384,327 S | 9/1997 | Nakui |
| 5,708,707 A | 1/1998 | Halttlunen et al. |
| 5,711,013 A | 1/1998 | Collett et al. |
| D392,248 S | 3/1998 | Johansson |
| D392,939 S | 3/1998 | Finke-Anlauff |
| 5,786,106 A | 7/1998 | Armani |
| 5,816,459 A | 10/1998 | Armistead |
| D400,495 S | 11/1998 | Deslyper et al. |
| D400,496 S | 11/1998 | Barber et al. |
| 5,859,481 A | 1/1999 | Banyas |
| 5,864,766 A | 1/1999 | Chiang |
| D405,801 S | 2/1999 | Nagele et al. |
| D407,063 S | 3/1999 | Reis et al. |
| 5,876,351 A | 3/1999 | Rohde |
| D407,708 S | 4/1999 | Nagele et al. |
| 5,896,277 A | 4/1999 | Leon et al. |
| 5,959,433 A | 9/1999 | Rohde |
| 5,973,477 A | 10/1999 | Chang |
| D417,189 S | 11/1999 | Amero, Jr. et al. |
| 6,043,626 A | 3/2000 | Snyder et al. |
| D424,512 S | 5/2000 | Ho |
| 6,081,595 A | 6/2000 | Picaud |
| D428,019 S | 7/2000 | Amron |
| 6,082,535 A | 7/2000 | Mitchell |
| 6,171,138 B1 | 1/2001 | Lefebvre et al. |
| D438,004 S | 2/2001 | Watson et al. |
| 6,184,654 B1 | 2/2001 | Bachner, III et al. |
| D439,218 S | 3/2001 | Yu |
| 6,201,867 B1 | 3/2001 | Koike |
| 6,208,115 B1 | 3/2001 | Binder |
| 6,266,539 B1 | 7/2001 | Pardo |
| D446,497 S | 8/2001 | Yu |
| 6,273,252 B1 | 8/2001 | Mitchell |
| D447,462 S | 9/2001 | Kosiba |
| 6,313,982 B1 | 11/2001 | Hino |
| 6,317,313 B1 | 11/2001 | Mosgrove et al. |
| 6,324,380 B1 | 11/2001 | Kiuchi et al. |
| 6,346,791 B1 | 2/2002 | Berguirdjian |
| 6,405,056 B1 | 6/2002 | Altschul et al. |
| D460,411 S | 7/2002 | Wang |
| D460,761 S | 7/2002 | Croley |
| 6,415,138 B2 | 7/2002 | Sirola et al. |
| 6,445,577 B1 | 9/2002 | Madsen et al. |
| 6,471,056 B1 | 10/2002 | Tzeng |
| D469,427 S | 1/2003 | Ma et al. |
| 6,536,589 B2 | 3/2003 | Chang |
| 6,538,413 B1 | 3/2003 | Beard et al. |
| D472,384 S | 4/2003 | Richardson |
| 6,552,513 B1 | 4/2003 | Li |
| 6,555,990 B1 | 4/2003 | Yang |
| 6,583,601 B2 | 6/2003 | Simoes et al. |
| 6,614,722 B2 | 9/2003 | Polany et al. |
| 6,626,362 B1 | 9/2003 | Steiner et al. |
| D481,716 S | 11/2003 | He et al. |
| D482,529 S | 11/2003 | Hardigg et al. |
| 6,646,864 B2 | 11/2003 | Richardson |
| D484,874 S | 1/2004 | Chang et al. |
| D485,834 S | 1/2004 | Davetas |
| 6,681,003 B2 | 1/2004 | Linder et al. |
| 6,701,159 B1 | 3/2004 | Powell |
| 6,708,887 B1 | 3/2004 | Garrett et al. |
| 6,714,802 B1 | 3/2004 | Barvesten |
| 6,785,566 B1 | 8/2004 | Irizarry |
| 6,819,549 B1 | 11/2004 | Lammers-Meis et al. |
| D500,041 S | 12/2004 | Tsujimoto |
| D506,612 S | 6/2005 | Rosa et al. |
| D508,495 S | 8/2005 | Bone et al. |
| D513,123 S | 12/2005 | Richardson et al. |
| 6,980,777 B2 | 12/2005 | Shepherd et al. |
| D513,451 S | 1/2006 | Richardson et al. |
| 6,992,461 B2 | 1/2006 | Liang et al. |
| D514,808 S | 2/2006 | Morine et al. |
| D516,309 S | 3/2006 | Richardson et al. |
| D516,553 S | 3/2006 | Richardson et al. |
| D516,554 S | 3/2006 | Richardson et al. |
| D516,807 S | 3/2006 | Richardson et al. |
| D517,007 S | 3/2006 | Yong-Jian et al. |
| D520,744 S | 5/2006 | Pangerc et al. |
| 7,050,841 B1 | 5/2006 | Onda |
| 7,069,063 B2 | 6/2006 | Halkosaari et al. |
| D525,582 S | 7/2006 | Chan |
| 7,072,699 B2 | 7/2006 | Eiden |
| 7,079,879 B1 | 7/2006 | Sylvester et al. |
| 7,081,736 B2 | 7/2006 | Seil et al. |
| D526,780 S | 8/2006 | Richardson et al. |
| D526,958 S | 8/2006 | Shimizu |
| D530,079 S | 10/2006 | Thomas et al. |
| D535,252 S | 1/2007 | Sandnes |
| 7,158,376 B2 | 1/2007 | Richardson et al. |
| 7,166,987 B2 | 1/2007 | Lee et al. |
| D537,063 S | 2/2007 | Kim et al. |
| 7,180,735 B2 | 2/2007 | Thomas et al. |
| 7,180,754 B2 | 2/2007 | Qin et al. |
| 7,194,291 B2 | 3/2007 | Peng |
| D540,539 S | 4/2007 | Gutierrez |
| 7,203,467 B2 | 4/2007 | Siddiqui |
| D542,286 S | 5/2007 | Taniyama et al. |
| D542,524 S | 5/2007 | Richardson et al. |
| D543,541 S | 5/2007 | Chung et al. |
| D544,486 S | 6/2007 | Hussaini et al. |
| 7,230,823 B2 | 6/2007 | Richardson et al. |
| D547,056 S | 7/2007 | Griffin et al. |
| D547,057 S | 7/2007 | Griffin et al. |
| D550,455 S | 9/2007 | Barnhart |
| D551,252 S | 9/2007 | Andre et al. |
| 7,266,391 B2 | 9/2007 | Warren |
| D551,856 S | 10/2007 | Ko et al. |
| D553,857 S | 10/2007 | Pendergraph et al. |
| D556,679 S | 12/2007 | Weinstein et al. |
| D556,681 S | 12/2007 | Kim |
| D557,205 S | 12/2007 | Kim et al. |
| D557,264 S | 12/2007 | Richardson et al. |
| D557,494 S | 12/2007 | Mayette et al. |
| D557,897 S | 12/2007 | Richardson et al. |
| 7,312,984 B2 | 12/2007 | Richardson et al. |
| D558,667 S | 1/2008 | Park et al. |
| D558,757 S | 1/2008 | Andre et al. |
| D558,972 S | 1/2008 | Oh |
| D558,973 S | 1/2008 | Hussaini et al. |
| D559,267 S | 1/2008 | Griffin |
| D560,229 S | 1/2008 | Yagi |
| D561,092 S | 2/2008 | Kim |
| 7,336,973 B2 | 2/2008 | Goldthwaite et al. |
| D563,093 S | 3/2008 | Nussberger |
| 7,343,184 B2 | 3/2008 | Rostami |
| D565,291 S | 4/2008 | Brandenburg et al. |
| 7,397,658 B2 | 7/2008 | Finke-Anlauff et al. |
| 7,400,917 B2 * | 7/2008 | Wood et al. ............... 455/575.8 |
| D574,326 S | 8/2008 | Lim |
| D574,819 S | 8/2008 | Andre et al. |
| D575,056 S | 8/2008 | Tan |
| 7,428,427 B2 | 9/2008 | Brunstrom et al. |
| D577,904 S | 10/2008 | Sasaki |
| D581,151 S | 11/2008 | Aipa |
| D581,155 S | 11/2008 | Richardson et al. |
| D581,421 S | 11/2008 | Richardson et al. |
| D582,149 S | 12/2008 | Tan |
| 7,464,814 B2 | 12/2008 | Carnevali |
| D584,732 S | 1/2009 | Cho et al. |
| 7,479,759 B2 | 1/2009 | Vilanov et al. |
| D587,008 S | 2/2009 | Richardson et al. |

(56) References Cited

U.S. PATENT DOCUMENTS

| | | |
|---|---|---|
| D587,896 S | 3/2009 | Aipa |
| D589,016 S | 3/2009 | Richardson et al. |
| 7,536,099 B2 | 5/2009 | Dalby et al. |
| D593,319 S | 6/2009 | Richardson et al. |
| D593,746 S | 6/2009 | Richardson et al. |
| D594,849 S | 6/2009 | Ko |
| 7,555,325 B2 | 6/2009 | Goros |
| D597,089 S | 7/2009 | Khan et al. |
| 7,562,813 B2 | 7/2009 | Humphrey et al. |
| D597,301 S | 8/2009 | Richardson et al. |
| D598,407 S | 8/2009 | Richardson et al. |
| 7,577,462 B2 | 8/2009 | Kumar |
| D600,640 S | 9/2009 | Stein et al. |
| D600,908 S | 9/2009 | Richardson et al. |
| D601,955 S | 10/2009 | Ekmekdje |
| D601,959 S | 10/2009 | Lee et al. |
| D601,960 S | 10/2009 | Dai |
| 7,609,512 B2 | 10/2009 | Richardson et al. |
| D603,602 S | 11/2009 | Richardson et al. |
| D603,603 S | 11/2009 | Laine et al. |
| 7,612,997 B1 | 11/2009 | Diebel et al. |
| D605,850 S | 12/2009 | Richardson et al. |
| D606,528 S | 12/2009 | Khan et al. |
| D606,529 S | 12/2009 | Ferrari et al. |
| 7,635,086 B2 | 12/2009 | Spencer, II |
| 7,638,969 B2 | 12/2009 | Woud |
| 7,647,082 B2 | 1/2010 | Holmberg |
| D609,228 S | 2/2010 | Ferrari et al. |
| D609,463 S | 2/2010 | Bullen |
| D610,538 S | 2/2010 | Wu et al. |
| 7,656,120 B2 | 2/2010 | Neu et al. |
| 7,663,878 B2 | 2/2010 | Swan et al. |
| 7,667,433 B1 | 2/2010 | Smith |
| D610,807 S | 3/2010 | Bau |
| D611,042 S | 3/2010 | Ferrari et al. |
| D611,478 S | 3/2010 | Richardson et al. |
| 7,669,829 B2 | 3/2010 | Ogatsu |
| D613,282 S | 4/2010 | Richardson et al. |
| D615,077 S | 5/2010 | Richardson et al. |
| D615,535 S | 5/2010 | Richardson et al. |
| D615,536 S | 5/2010 | Richardson et al. |
| D615,967 S | 5/2010 | Richardson et al. |
| D616,360 S | 5/2010 | Huang |
| D616,361 S | 5/2010 | Huang |
| D617,753 S | 6/2010 | Cheng |
| D617,784 S | 6/2010 | Richardson et al. |
| D617,785 S | 6/2010 | Richardson et al. |
| D617,786 S | 6/2010 | Richardson et al. |
| D617,787 S | 6/2010 | Richardson et al. |
| D618,231 S | 6/2010 | Fahrendorff et al. |
| 7,733,637 B1 | 6/2010 | Lam |
| D619,573 S | 7/2010 | Khan et al. |
| D619,574 S | 7/2010 | Richardson et al. |
| D619,991 S | 7/2010 | Huang |
| D620,487 S | 7/2010 | Richardson et al. |
| D621,394 S | 8/2010 | Richardson et al. |
| D621,395 S | 8/2010 | Richardson et al. |
| D621,821 S | 8/2010 | Richardson et al. |
| D621,822 S | 8/2010 | Richardson et al. |
| 7,778,023 B1 | 8/2010 | Mohoney |
| 7,782,610 B2 | 8/2010 | Diebel et al. |
| D623,179 S | 9/2010 | Richardson et al. |
| D623,180 S | 9/2010 | Diebel |
| D623,638 S | 9/2010 | Richardson et al. |
| D623,639 S | 9/2010 | Richardson et al. |
| D623,640 S | 9/2010 | Freeman |
| D624,317 S | 9/2010 | Wenchel et al. |
| D624,533 S | 9/2010 | Richardson et al. |
| D624,908 S | 10/2010 | Huskinson |
| D624,909 S | 10/2010 | Huskinson |
| D624,910 S | 10/2010 | Richardson et al. |
| D625,303 S | 10/2010 | Kim |
| D626,120 S | 10/2010 | Richardson et al. |
| D626,121 S | 10/2010 | Richardson et al. |
| D626,538 S | 11/2010 | Brown et al. |
| D626,539 S | 11/2010 | Brown et al. |
| D626,540 S | 11/2010 | Brown et al. |
| D626,964 S | 11/2010 | Richardson et al. |
| D628,568 S | 12/2010 | Richardson et al. |
| D628,994 S | 12/2010 | Griffin, Jr. et al. |
| 7,859,222 B2 | 12/2010 | Woud |
| D631,246 S | 1/2011 | Boettner |
| 7,863,856 B2 | 1/2011 | Sherman et al. |
| 7,863,862 B2 | 1/2011 | Idzik et al. |
| D631,877 S | 2/2011 | Rak et al. |
| D632,648 S | 2/2011 | Yang |
| D632,683 S | 2/2011 | Richardson et al. |
| D632,684 S | 2/2011 | Richardson et al. |
| D632,685 S | 2/2011 | Richardson et al. |
| D632,686 S | 2/2011 | Magness et al. |
| 7,889,489 B2 | 2/2011 | Richardson et al. |
| 7,889,498 B2 | 2/2011 | Diebel et al. |
| D634,704 S | 3/2011 | Tieleman et al. |
| D634,741 S | 3/2011 | Richardson et al. |
| 7,899,397 B2 | 3/2011 | Kumar |
| 7,907,394 B2 | 3/2011 | Richardson et al. |
| 7,911,530 B2 | 3/2011 | Sawachi |
| D636,386 S | 4/2011 | Richardson et al. |
| D636,387 S | 4/2011 | Willes et al. |
| 7,930,011 B2 | 4/2011 | Shi et al. |
| 7,933,122 B2 | 4/2011 | Richardson et al. |
| D637,588 S | 5/2011 | Richardson et al. |
| D637,589 S | 5/2011 | Willes et al. |
| D637,590 S | 5/2011 | Michie et al. |
| D637,591 S | 5/2011 | Willes et al. |
| D637,592 S | 5/2011 | Magness et al. |
| D637,952 S | 5/2011 | Tan |
| D638,005 S | 5/2011 | Richardson et al. |
| D638,411 S | 5/2011 | Willes et al. |
| D638,413 S | 5/2011 | Magness et al. |
| D638,414 S | 5/2011 | Magness et al. |
| D638,828 S | 5/2011 | Melanson et al. |
| D638,829 S | 5/2011 | Melanson et al. |
| D638,830 S | 5/2011 | Magness et al. |
| D639,731 S | 6/2011 | Sun |
| D640,679 S | 6/2011 | Willes et al. |
| D640,680 S | 6/2011 | Magness et al. |
| 7,957,524 B2 | 6/2011 | Chipping |
| D641,013 S | 7/2011 | Richardson et al. |
| D641,014 S | 7/2011 | Smith et al. |
| D641,974 S | 7/2011 | Stampfli |
| D642,170 S | 7/2011 | Johnson et al. |
| D642,171 S | 7/2011 | Melanson et al. |
| D642,558 S | 8/2011 | Magness |
| D643,029 S | 8/2011 | Feng |
| D643,424 S | 8/2011 | Richardson et al. |
| D644,215 S | 8/2011 | Dong |
| D644,216 S | 8/2011 | Richardson et al. |
| D644,219 S | 8/2011 | Sawada |
| 7,988,010 B2 | 8/2011 | Yang et al. |
| 8,004,962 B2 | 8/2011 | Yang et al. |
| D644,635 S | 9/2011 | Richardson et al. |
| D644,639 S | 9/2011 | Weller et al. |
| D647,084 S | 10/2011 | Fathollahi |
| D647,108 S | 10/2011 | Lee |
| 8,028,794 B1 | 10/2011 | Freeman |
| 8,046,039 B2 | 10/2011 | Lee et al. |
| D648,714 S | 11/2011 | Jones, III et al. |
| D648,715 S | 11/2011 | Jones, III et al. |
| D648,716 S | 11/2011 | Jones, III et al. |
| D648,717 S | 11/2011 | Fahrendorff et al. |
| D649,143 S | 11/2011 | Jones, III et al. |
| D649,539 S | 11/2011 | Hong |
| D650,810 S | 12/2011 | Lemelman et al. |
| D652,827 S | 1/2012 | Fahrendorff et al. |
| D652,828 S | 1/2012 | Fahrendorff et al. |
| D653,202 S | 1/2012 | Hasbrook et al. |
| D653,659 S | 2/2012 | Fahrendorff et al. |
| D654,069 S | 2/2012 | Kwon et al. |
| D654,483 S | 2/2012 | Richardson et al. |
| D654,931 S | 2/2012 | Lemelman et al. |
| D655,281 S | 3/2012 | Turocy |
| D655,699 S | 3/2012 | Bau |
| D656,495 S | 3/2012 | Andre et al. |

(56) References Cited

U.S. PATENT DOCUMENTS

| | | |
|---|---|---|
| D658,165 S | 4/2012 | Freeman |
| 8,150,485 B2 | 4/2012 | Lee |
| D658,643 S | 5/2012 | Fahrendorff et al. |
| 8,167,127 B2 | 5/2012 | Martin et al. |
| D662,923 S | 7/2012 | Piedra et al. |
| D663,263 S | 7/2012 | Gupta et al. |
| D663,319 S | 7/2012 | Chen et al. |
| D664,091 S | 7/2012 | Pliner et al. |
| 8,224,408 B2 | 7/2012 | Tomasini et al. |
| D665,386 S | 8/2012 | Fathollahi |
| D665,735 S | 8/2012 | Kang et al. |
| 8,245,842 B2 | 8/2012 | Bau |
| 8,247,102 B2 | 8/2012 | Hua |
| D667,783 S | 9/2012 | Zhang et al. |
| D670,281 S | 11/2012 | Corpuz et al. |
| D670,689 S | 11/2012 | Wang |
| D671,105 S | 11/2012 | Rothbaum et al. |
| D671,106 S | 11/2012 | Rothbaum et al. |
| D671,493 S | 11/2012 | Hasbrook et al. |
| 8,321,619 B2 | 11/2012 | Kular et al. |
| 8,328,008 B2 | 12/2012 | Diebel et al. |
| D674,394 S | 1/2013 | Kajimoto |
| D675,603 S | 2/2013 | Melanson et al. |
| D676,032 S | 2/2013 | Stump et al. |
| D676,432 S | 2/2013 | Hasbrook et al. |
| 8,367,235 B2 | 2/2013 | Huang et al. |
| 8,380,264 B2 | 2/2013 | Hung et al. |
| D677,249 S | 3/2013 | Li et al. |
| D678,869 S | 3/2013 | Diebel |
| 8,393,466 B2 | 3/2013 | Rayner |
| D679,271 S | 4/2013 | Liu |
| D679,684 S | 4/2013 | Baker et al. |
| D682,196 S | 5/2013 | Leung |
| 8,452,242 B2 | 5/2013 | Spencer, II |
| 8,457,701 B2 | 6/2013 | Diebel |
| D685,356 S | 7/2013 | Diebel |
| D686,152 S | 7/2013 | Lee et al. |
| D686,606 S | 7/2013 | Hong |
| 8,483,758 B2 | 7/2013 | Huang |
| D687,426 S | 8/2013 | Requa |
| 8,499,933 B2 | 8/2013 | Ziemba |
| 8,505,718 B2 | 8/2013 | Griffin, Jr. et al. |
| 8,509,864 B1 | 8/2013 | Diebel |
| 8,531,833 B2 | 9/2013 | Diebel et al. |
| D691,990 S | 10/2013 | Rayner |
| 8,560,014 B1 | 10/2013 | Hu et al. |
| D693,801 S | 11/2013 | Rayner |
| 8,579,172 B2 | 11/2013 | Monaco et al. |
| D696,234 S | 12/2013 | Wright |
| D697,502 S | 1/2014 | Chu et al. |
| D698,774 S | 2/2014 | Wardy |
| D704,688 S | 5/2014 | Reivo et al. |
| D706,255 S | 6/2014 | Akana et al. |
| D710,795 S | 8/2014 | Gupta et al. |
| D711,312 S | 8/2014 | Tien |
| D711,863 S | 8/2014 | Wen |
| D714,278 S | 9/2014 | Case et al. |
| D716,784 S | 11/2014 | Wen |
| D716,785 S | 11/2014 | White |
| 2001/0054148 A1 | 12/2001 | Hoornaert et al. |
| 2002/0111189 A1 | 8/2002 | Chou |
| 2002/0147035 A1 | 10/2002 | Su |
| 2002/0197965 A1 | 12/2002 | Peng |
| 2003/0000984 A1 | 1/2003 | Vick, III |
| 2003/0096642 A1 | 5/2003 | Bessa et al. |
| 2003/0151890 A1 | 8/2003 | Huang et al. |
| 2003/0217210 A1 | 11/2003 | Carau, Sr. |
| 2003/0218445 A1 | 11/2003 | Behar |
| 2003/0228866 A1 | 12/2003 | Pezeshki |
| 2004/0096054 A1 | 5/2004 | Nuovo |
| 2004/0097256 A1 | 5/2004 | Kujawski |
| 2004/0104268 A1 | 6/2004 | Bailey |
| 2004/0268005 A1* | 12/2004 | Dickie ............... 710/303 |
| 2005/0088141 A1 | 4/2005 | Lee et al. |
| 2005/0090301 A1 | 4/2005 | Lange et al. |
| 2005/0093510 A1 | 5/2005 | Seil et al. |
| 2005/0116684 A1 | 6/2005 | Kim |
| 2005/0231159 A1 | 10/2005 | Jones et al. |
| 2005/0247787 A1 | 11/2005 | Von Mueller et al. |
| 2005/0248312 A1 | 11/2005 | Cao et al. |
| 2005/0286212 A1 | 12/2005 | Brignone et al. |
| 2006/0010588 A1 | 1/2006 | Schuster et al. |
| 2006/0052064 A1 | 3/2006 | Goradesky |
| 2006/0058073 A1 | 3/2006 | Kim |
| 2006/0063569 A1 | 3/2006 | Jacobs et al. |
| 2006/0099999 A1 | 5/2006 | Park |
| 2006/0105722 A1* | 5/2006 | Kumar .................. 455/90.3 |
| 2006/0105824 A1 | 5/2006 | Kim et al. |
| 2006/0125445 A1 | 6/2006 | Cao et al. |
| 2006/0205447 A1 | 9/2006 | Park et al. |
| 2006/0255493 A1 | 11/2006 | Fouladpour |
| 2007/0004450 A1 | 1/2007 | Parikh |
| 2007/0019804 A1 | 1/2007 | Kramer |
| 2007/0093140 A1 | 4/2007 | Begic et al. |
| 2007/0123316 A1 | 5/2007 | Little |
| 2007/0142097 A1 | 6/2007 | Hamasaki et al. |
| 2007/0152633 A1 | 7/2007 | Lee |
| 2007/0161404 A1 | 7/2007 | Yasujima et al. |
| 2007/0167190 A1 | 7/2007 | Moosavi et al. |
| 2007/0225031 A1 | 9/2007 | Bodkin et al. |
| 2007/0236180 A1 | 10/2007 | Rodgers |
| 2007/0261978 A1 | 11/2007 | Sanderson |
| 2007/0262134 A1 | 11/2007 | Humphrey et al. |
| 2007/0297149 A1 | 12/2007 | Richardson et al. |
| 2008/0007214 A1 | 1/2008 | Cheng |
| 2008/0026794 A1 | 1/2008 | Warren |
| 2008/0026803 A1 | 1/2008 | Demuynck |
| 2008/0032758 A1 | 2/2008 | Rostami |
| 2008/0053770 A1 | 3/2008 | Tynyk |
| 2008/0096620 A1 | 4/2008 | Lee et al. |
| 2008/0108395 A1 | 5/2008 | Lee et al. |
| 2008/0119244 A1 | 5/2008 | Malhotra |
| 2008/0123287 A1* | 5/2008 | Rossell et al. ............ 361/686 |
| 2008/0132289 A1 | 6/2008 | Wood et al. |
| 2008/0150367 A1 | 6/2008 | Oh et al. |
| 2009/0009945 A1 | 1/2009 | Johnson et al. |
| 2009/0017883 A1 | 1/2009 | Lin |
| 2009/0051319 A1 | 2/2009 | Fang et al. |
| 2009/0069050 A1 | 3/2009 | Jain et al. |
| 2009/0073650 A1 | 3/2009 | Huang et al. |
| 2009/0096417 A1 | 4/2009 | Idzik et al. |
| 2009/0108800 A1 | 4/2009 | Woud |
| 2009/0111543 A1 | 4/2009 | Tai et al. |
| 2009/0114556 A1 | 5/2009 | Tai et al. |
| 2009/0117955 A1 | 5/2009 | Lo |
| 2009/0128092 A1 | 5/2009 | Woud |
| 2009/0143104 A1 | 6/2009 | Loh et al. |
| 2009/0144456 A1 | 6/2009 | Gelf et al. |
| 2009/0146898 A1 | 6/2009 | Akiho et al. |
| 2009/0160399 A1 | 6/2009 | Woud |
| 2009/0160400 A1 | 6/2009 | Woud |
| 2009/0181729 A1 | 7/2009 | Griffin, Jr. et al. |
| 2009/0205983 A1 | 8/2009 | Estlander |
| 2009/0247244 A1 | 10/2009 | Mittleman et al. |
| 2009/0284216 A1 | 11/2009 | Bessa et al. |
| 2009/0301289 A1 | 12/2009 | Gynes |
| 2009/0312058 A9 | 12/2009 | Wood et al. |
| 2009/0314400 A1 | 12/2009 | Liu |
| 2009/0325657 A1 | 12/2009 | Ramsdell et al. |
| 2010/0013431 A1 | 1/2010 | Liu |
| 2010/0022277 A1 | 1/2010 | An et al. |
| 2010/0026589 A1 | 2/2010 | Dou et al. |
| 2010/0048267 A1 | 2/2010 | Lin |
| 2010/0056054 A1 | 3/2010 | Yamato et al. |
| 2010/0064883 A1 | 3/2010 | Gynes |
| 2010/0078343 A1 | 4/2010 | Hoellwarth et al. |
| 2010/0088439 A1 | 4/2010 | Ang et al. |
| 2010/0093412 A1 | 4/2010 | Serra et al. |
| 2010/0096284 A1 | 4/2010 | Bau |
| 2010/0113106 A1* | 5/2010 | Supran .................. 455/573 |
| 2010/0154062 A1 | 6/2010 | Baram et al. |
| 2010/0195279 A1 | 8/2010 | Michael |
| 2010/0200456 A1 | 8/2010 | Parkinson |
| 2010/0203931 A1 | 8/2010 | Hynecek et al. |

(56) References Cited

U.S. PATENT DOCUMENTS

| | | | |
|---|---|---|---|
| 2010/0224519 | A1 | 9/2010 | Kao |
| 2010/0243516 | A1 | 9/2010 | Martin et al. |
| 2010/0302716 | A1 | 12/2010 | Gandhi |
| 2010/0328203 | A1 | 12/2010 | Hsu |
| 2011/0049005 | A1 | 3/2011 | Wilson et al. |
| 2011/0055447 | A1 | 3/2011 | Costa |
| 2011/0084081 | A1 | 4/2011 | Chung et al. |
| 2011/0090626 | A1 | 4/2011 | Hoellwarth et al. |
| 2011/0117974 | A1 | 5/2011 | Spitalnik et al. |
| 2011/0136555 | A1 | 6/2011 | Ramies et al. |
| 2011/0159324 | A1 | 6/2011 | Huang et al. |
| 2011/0199041 | A1 | 8/2011 | Yang |
| 2011/0253569 | A1 | 10/2011 | Lord |
| 2011/0259664 | A1 | 10/2011 | Freeman |
| 2011/0287726 | A1 | 11/2011 | Huang |
| 2011/0297578 | A1 | 12/2011 | Stiehl et al. |
| 2012/0013295 | A1 | 1/2012 | Yeh |
| 2012/0071214 | A1 | 3/2012 | Ash, Jr. et al. |
| 2012/0088555 | A1 | 4/2012 | Hu |
| 2012/0088558 | A1 | 4/2012 | Song |
| 2012/0122520 | A1 | 5/2012 | Phillips |
| 2012/0161696 | A1 | 6/2012 | Cook et al. |
| 2012/0209745 | A1 | 8/2012 | Spencer, II |
| 2012/0282977 | A1 | 11/2012 | Haleluk |
| 2012/0303520 | A1 | 11/2012 | Huang et al. |
| 2013/0045775 | A1 | 2/2013 | Heywood |
| 2013/0084799 | A1 | 4/2013 | Marholev et al. |
| 2013/0125251 | A1 | 5/2013 | Johnson |
| 2013/0189923 | A1 | 7/2013 | Lewin |
| 2013/0273983 | A1 | 10/2013 | HSU |
| 2013/0314880 | A1 | 11/2013 | Sun et al. |
| 2014/0065948 | A1 | 3/2014 | Huang |
| 2014/0165379 | A1 | 6/2014 | Diebel et al. |

FOREIGN PATENT DOCUMENTS

| | | |
|---|---|---|
| CN | 202535667 U | 11/2012 |
| CN | 302510329 S | 7/2013 |
| CN | 302573150 S | 9/2013 |
| EP | 1732291 A1 | 12/2006 |
| JP | 8-18637 | 1/1996 |
| JP | 2000-175720 | 6/2000 |
| KR | 10-2005-0027961 | 3/2005 |
| KR | 10-2008-0017688 | 2/2008 |
| KR | 20-2010-0005030 | 5/2010 |
| KR | 10-2010-0132724 | 12/2010 |
| KR | 10-2011-0005507 | 1/2011 |
| KR | 30-0650361 | 7/2012 |
| TW | D150044 | 11/2012 |
| TW | D156538 | 10/2013 |
| WO | WO 95/15619 | 6/1995 |
| WO | WO 97/33497 | 9/1997 |
| WO | WO 03/065227 A1 | 8/2003 |
| WO | WO 2008/151362 A2 | 12/2008 |

OTHER PUBLICATIONS

U.S. Appl. No. 14/494,348 including its prosecution history, filed Sep. 23, 2014, Huang et al.
U.S. Appl. No. 14/517,492 including its prosecution history, filed Oct. 17, 2014, Huang et al.
U.S. Appl. No. 14/569,229 including its prosecution history, filed Dec. 12, 2014, Huang et al.
U.S. Appl. No. 14/547,060 including its prosecution history, filed Nov. 18, 2014, Huang et al.
U.S. Appl. No. 14/187,046 Including its prosecution history, filed Feb. 21, 2014, To et al.
U.S. Appl. No. 14/205,024 Including its prosecution history, filed Mar. 11, 2014, Huang et al.
U.S. Appl. No. 14/205,167 Including its prosecution history, filed Mar. 11, 2014, Huang et al.
U.S. Appl. No. 29/427,724 Including its prosecution history, filed Jul. 20, 2012, Brand et al.
U.S. Appl. No. 29/382,515 Including its prosecution history filed Jan. 4, 2011, Gallouzi et al.
U.S. Appl. No. 29/423,032 Including its prosecution history, filed May 25, 2012, Hasbrook et al.
U.S. Appl. No. 29/406,346 Including its prosecution history, filed Nov. 11, 2011, Brand.
U.S. Appl. No. 29/423,026 Including its prosecution history, filed May 25, 2012, Hasbrook et al.
U.S. Appl. No. 29/433,665 Including its prosecution history, filed Oct. 3, 2012, Namminga et al.
U.S. Appl. No. 29/464,620 Including its prosecution history, filed Aug. 19, 2013, Tsai.
U.S. Appl. No. 29/438,697 Including its prosecution history, filed Nov. 30, 2012, Namminga et al.
U.S. Appl. No. 29/451,703 Including its prosecution history, filed Apr. 6, 2013, Tsai et al.
U.S. Appl. No. 29/435,908 Including its prosecution history, filed Oct. 3, 2012, To et al.
U.S. Appl. No. 29/435,907 Including its prosecution history, filed Oct. 30, 2012, To et al.
U.S. Appl. No. 29/438,877 Including its prosecution history, filed Dec. 4, 2012, To et al.
U.S. Appl. No. 29/440,062 Including its prosecution history, filed Dec. 18, 2012, To et al.
U.S. Appl. No. 29/478,391 Including its prosecution history, filed Jan. 3, 2014, Namminga et al.
U.S. Appl. No. 29/478,390 Including its prosecution history, filed Jan. 3, 2014, Dang et al.
U.S. Appl. No. 29/478,383 Including its prosecution history, filed Jan. 3, 2014, Dang et al.
U.S. Appl. No. 29/478,388, Including its prosecution history, filed Jan. 3, 2014, Kim et al.
U.S. Appl. No. 14/330,613, Including its prosecution history, filed Jul. 14, 2014, Diebel et al.
U.S. Appl. No. 29/499,868, Including its prosecution history, filed Aug. 19, 2014, Mophie Inc.
International Search Report and Written Opinion of the International Searching Authority for PCT/US2011/037244, dated Jul. 19, 2011.
International Preliminary Report on Patentability for PCT/US2011/037244, dated Nov. 29, 2012.
International Search Report and Written Opinion of the International Searching Authority for PCT/US2011/037249, dated Jul. 13, 2011.
International Preliminary Report on Patentability for PCT/US2011/037249, dated Nov. 29, 2012.
International Search Report and Written Opinion of the International Searching Authority for PCT/US2011/037254, dated Jul. 13, 2011.
International Preliminary Report on Patentability for PCT/US2011/037254, dated Nov. 29, 2012.
International Search Report and Written Opinion of the International Searching Authority for PCT/US2011/037257, dated Sep. 22, 2011.
International Preliminary Report on Patentability for PCT/US2011/037257, dated Nov. 29, 2012.
International Search Report and Written Opinion of the International Searching Authority for PCT/US2012/041768, dated Feb. 27, 2013.
International Preliminary Report on Patentability for PCT/US2012/041768, dated Dec. 27, 2013.
International Search Report and Written Opinion of the International Searching Authority for PCT/US2013/057276, dated Dec. 10, 2013.
International Search Report and Written Opinion of the International Searching Authority for PCT/US2014/017781, dated Jun. 8, 2014.
International Search Report and Written Opinion of the International Searching Authority for PCT/US2014/023592, dated Aug. 28, 2014.
Mophie Pulse for iPod Touch 4G, http://www.mophie.com/pulse-iPod-Touch-4th-Gen-vibrating-gaming-case-p/2015_PUL-T4-GRY.htm.
"Sandberg BatteryCase for iPhone 4/4S delivers more band for your buck," dated Mar. 15, 2012, http://www.gizmag.com/sanberg-batterycase-iphone/21839.
Shawn Brown, "Incase Power Slider battery doubles as a case," dated Nov. 19, 2008, http://www.iphonebuzz.com/incase-power-slider-battery-doubles-as-a-case-195224.php.

(56) References Cited

OTHER PUBLICATIONS

Nick Guy, "Incipio offGRID Battery Case for iPhone 5/5s," dated Oct. 9, 2013, http://www.ilounge.com/index.php/reviews/entry/incipio-offgrid-battery-case-for-iphone-5-5s/.
Jeremy Horwitz, "Mophie Juice Pack Plus for iPhone 5," dated May 21, 2013, http://www.ilounge.com/index.php/reviews/entry/mophie-juice-pack-plus-for-iphone-5/.
Nick Guy, "RND Power Solutions Sync & Charge Dock with Lightning Connector," dated Nov. 18, 2013, http://www.ilounge.com/index.php/reviews/entry/tylt-energi-sl.
Jeremy Horwitz, "Kensington Mini Battery Pack and Charger for iPhone and iPod," dated May 16, 2008, http://www.ilounge.com/index.php/reviews/entry/kensington-mini-battery-pack-and-charger-for-iphone-and-ipod/.
Kensington Mini Battery Pack and Charger for iPhone and iPod, dated Sep. 30, 2008, 1 Page.
Sven Rafferty, "Mybat External Battery for iPhone and iPod," dated May 18, 2008, http://svenontech.com/reviews/?p=74.
Dave Rees, "Richard Solo Backup Battery for iPhone / iPod Review," dated Jun. 16, 2008, http://the-gadgeteer.com/2008/06/16/richard_solo_backup_battery_for_iphone_ipod/.
Devin Coldewey, "Combination iPhone battery pack and flash from FastMac," dated Nov. 4, 2008, http://crunchgear.com/2008/11/04/combination-iphone-battery-packand-flash-from-fastmac/.
"Cheap DIY iPhone External Battery," dated Jul. 22, 2008, http://fastdad.wordpress.com/2008/07/22/cheap-diy-iphone-external-battery/.
Jeremy Horwitz, "iLuv i603 / i604 Rechargeable Lithium Polymer Batteries with Silicone Skin," dated Jun. 27, 2006, http://www.ilounge.com/index.php/reviews/entry/iluv-i603-rechargeable-lithium-polymer-battery-with-silicone-skin/.
Julie Strietelmeier, "Seidio INNODock Desktop Cradle for Treo 650," dated Jul. 28, 2005, http://the-gadgeteer.com/2005/07/28/seidio_innodock_desktop_cradle_for_treo_650/.
Brian Nyhuis, "Mophie Juice Pack Battery Case for Samsung Galaxy S III Review," dated Nov. 28, 2012, http://www.legitreviews.com/mophie-juice-pack-battery-case-for-samsung-galaxy-s-iii-review_2084.
"PowerSkin Samsung Galaxy S3 Case with Backup Battery," dated Aug. 19, 2012, http://gadgetsin.com/powerskin-samsung-galaxy-s3-case-with-backup-battery.htm.
"iPhone 4 Case with Battery Pack," dated Sep. 28, 2010, http://gadgetsin.com/iphone-4-case-with-battery-pack.htm.
Jonathan Pena, "iPhone 5 Cases, Round 3," dated Sep. 16, 2012, http://www.technologytell.com/apple/103833/iphone-5-cases-round-3/.
Jeremy Horwitz, "Mophie Juice Pack for iPhone," dated Dec. 7, 2007, http://www.ilounge.com/index.php/reviews/entry/mphie-juice-pack-for-iphone/.
Dr. Macenstein, "Review: Mophie Juice Pack for iPhone," dated Apr. 27, 2008, http://macenstein.com/default/archives/1314.
Wayne Schulz, "iPhone Extended Battery Review—Mophie Juice Pack," dated Jun. 17, 2008, http://www.geardiary.com/2008/06/17/iphone-extended-battery-review-mophie-juice-pack/.
Mophie Juice Pack iPhone 1G Product—Figures 1-7—Retrieved from http://www.mophie.com/products/juice-pack on Apr. 10, 2009.
Mophie Juice Pack iPhone 1G Product—Figure 8—Retrieved from http://www.mophie.com/pp./information/ on Apr. 10, 2009.
Mophie Juice Pack iPhone 1G Product—Figures 9-14—Retrieved from http://www.mophie.com/blogs/Juice_Pack_FAQ on Apr. 10, 2009.
Mophie Juice Pack iPhone 1G Product—Figures 15-16—Retrieved from http://mophie.com/blogs/Juice_Pack_FAQ on Apr. 20, 2009. Figure 16 is dated May 1, 2008.
Tomas Ratas, "Mophie Juice Pack—iPhone 3G," dated Dec. 9, 2008, http://www.testfreaks.com/blog/review/mophie-juice-pack-iphone-3g/.
Dr. Macenstein, "Review: Mophie Juice Pack 3G for iPhone," dated Nov. 27, 2008, http://macenstein.com/default/archives/1820.
Ewdison Then, "Mophie Juice Pack iPhone 3G Review," dated Nov. 12, 2008, http://www.slashgear.com/mophie-juice-pack-iphone-3g-review-1222446/.
Mophie Juice Pack iPhone 3G Product—Figures 1-8—Retrieved from http://www.mophie.com/products/juice-pack-iphone-3g on Apr. 10, 2009.
Mophie Juice Pack iPhone 3G Product—Figures 9-10—Retrieved from http://www.mophie.com/pages/iphone-3g-details on Apr. 10, 2009.
Mophie Juice Pack iPhone 3G Product—Figures 11-14—Retrieved from http://mophie.com/blogs/Juice_Pack_3G_FAQ on Apr. 10, 2009.
Mophie Juice Pack iPhone 3G Product—Figures 15-16—Retrieved from http://mophie.com/blogs/press on Apr. 20, 2009. Figure 15 is dated Aug. 4, 2008, and Figure 16 is dated Nov. 10, 2008.
Mophie Juice Pack iPhone 3G User Manual—Retrieved from http://static3.shopify.com/s/files/1/0008/4942/assets/mophie_juice_pack_3G_manual_rl.pdf on Apr. 10, 2009.
Panasonic Lithium Ion Batteries Technical Handbook, dated 2007.
Chris Foresman, "Several Backup Batteries Can Extend Your Daily iPhone 3G Use," dated Jul. 18, 2008, http://arstechnica.com/apple/2008/07/several-backup-batteries-can-extend-your-daily-iphone-3g-use/.
Using Your Treo 650 Smartphone by palmOne, dated 2005.
Lisa Gade, "Palm Treo 750," dated Jan. 17, 2007, http://www.mobiletechreview.com/phones/Treo-750.htm.
Incase Power Slider 3G for iPhone 3G Product Reference, alleged by Incase to be available on Nov. 28, 2008.
iPhone User's Guide, 2007.
"Power Slider," Web Archive Date Dec. 4, 2008, https://web.archive.org/web/20081204105303/http://goincase.com/products/detail/power-slider-ec20003/?.
Azadeh Ensha, "A Case for Filling the iPhone 3G's Power Vacuum," Dated Nov. 27, 2008.
Joseph Flatley, "Incase Power Slider for iPhone 3G Doubles the Juice, Lets You Sync," dated Nov. 17, 2008.
Darren Quick, "Mophie Juice Pack for iPhone 3G now shipping," dated Nov. 10, 2008, http://www.gizmag.com/mophie-juice-pack-iphone-3g/10342/.
Otterbox Catalog, 2006.
Jeremy Horwitz, "PhoneSuit MiLi Power Pack for iPhone," Jan. 29, 2009, http://www.ilounge.com/index.php/reviews/entry/phonesuit-mili-power-pack-for-iphone/.
Jeremy Horwitz, "FastMac TruePower iV Universal Battery Charger," Dec. 11, 2008, http://www.ilounge.com/index.php/reviews/entry/fastmac-truepower-iv-universal-battery-charger/.
Jeremy Horwitz, "Konnet PowerKZ Extended Power for iPhone," Apr. 2, 2009, http://www.ilounge.com/index.php/reviews/entry/konnet-powerkz-extended-power-for-iphone/.
"Test: Batterie iPhone SKPAD" with Machine English Translation, Feb. 2, 2009, http://iphonesofa.com/2009/02/02/test-batterie-iphone-skpad.
Kanamori et al., "USB battery-charger designs meet new industry standards," EDN pp. 63-70, dated Feb. 21, 2008.
AVR458: Charging Lithium-Ion Batteries with ATAVRBC100, which appear to include a date of Aug. 2008.
Battery Charging Specification, dated Apr. 15, 2009.
BCM2033 Product Brief, 2 pages, dated Nov. 1, 2002.
"USB battery charger detector intelligently powers mobiles," Dec. 17, 2007, http://www.eetasia.com/ART_8800493819_765245_NP_10b171b6.HTMce#.
Webpage Archive, Mophie.com, Nov. 25, 2007.
Ben Kaufman, "Behind the Invention: The mophie Juice Pack," dated Dec. 31, 2013, https://medium.comi@benkaufman/behind-the-invention-the-mophie-juice-pack-a0620f74efcf.
Mophie Relo Recharge, dated Feb. 7, 2006, http://songsling.com/recharge.html.
*Case-Ari, LLC* v. *mStation, Inc.*, Case No. 1:2010-CV-01874 in the United States District Court for the Northern District of Georgia, filed Jun. 17, 2010 (Docket).
*Daniel Huang* v. *GC Technology, LLC*, Case No. CV10-4705 CAS (VBKx) in the United States District Court for the Central District of California, filed Jun. 24, 2010 (Docket).

(56) References Cited

OTHER PUBLICATIONS

*Hali-Power, Inc.* v. *mStation Corp.*, Case No. 1:2010-CV-00773 in the United States District Court for the Northern District of New York, filed Jun. 30, 2010 (Docket).
*Mophie, Inc.* v. *Loza & Loza, LLP*, Case No. SACV11-00539 DOC (MLGx) in the United States District Court for the Central District of California, filed Apr. 7, 2011 (Docket).
Mophie's Complaint, filed Apr. 7, 2011 in *Mophie, Inc.* v. *Loza & Loza, LLP*, Case No. SACV11-00539 DOC (MLGx) in the United States District Court for the Central District of California.
*Mophie, Inc.* v.*Foreign Trade Corporation*, Case No. 8:12-CV-00292-1ST-RNB in the United States District Court for the Central District of California, filed Feb. 24, 2012 (Docket).
*Mophie, Inc.* v. *Kdlinks Inc.*, Case No. 2:2012-CV-02639 in the United States District Court for the Central District of California, filed Mar. 27, 2012 (Docket).
*Otter Products, LLC* v. *Mophie, LLC*, Case No. 1:2012-CV-01969 in the United States District Court for the District of Colorado, filed Jul. 27, 2012 (Docket).
Mophie's Answer, filed Oct. 15, 2012 in *Otter Products, LLC* v. *Mophie, LLC*, Case No. 1:2012-CV-01969 in the United States District Court for the District of Colorado.
Otter's Motion for Summary Judgment of Infringement and Declaration in Support Thereof, filed May 13, 2013 in *Otter Products, LLC* v. *Mophie, LLC*, Case No. 1:2012-CV-01969 in the United States District Court for the District of Colorado.
Mophie's Opposition to Motion for Summary Judgment of Infringement, filed Jun. 6, 2013 in *Otter Products, LLC* v. *Mophie, LLC*, Case No. 1:2012-CV-01969 in the United States District Court for the District of Colorado.
Mophie's Claim Construction Brief, filed Jun. 14, 2013 in *Otter Products, LLC* v. *Mophie, LLC*, Case No. 1:2012-CV-01969 in the United States District Court for the District of Colorado.
Otter's Claim Construction Brief, filed Jun. 14, 2013 in *Otter Products, LLC* v. *Mophie, LLC*, Case No. 1:2012-CV-01969 in the United States District Court for the District of Colorado.
Mophie's Brief in Response to Otter's Claim Construction Brief, filed Jun. 24, 2013 in *Otter Products, LLC* v. *Mophie, LLC*, Case No. 1:2012-CV-01969 in the United States District Court for the District of Colorado.
Otter's Rebuttal Brief for Construction of Claim Terms and Declaration, filed Jun. 24, 2013 in *Otter Products, LLC* v. *Mophie, LLC*, Case No. 1:2012-CV-01969 in the United States District Court for the District of Colorado.
Otter's Reply in Support of Motion for Summary Judgment of Infringement, filed Jun. 24, 2013 in *Otter Products, LLC* v. *Mophie, LLC*, Case No. 1:2012-CV-01969 in the United States District Court for the District of Colorado.
Joint Claim Construction Statement, filed Jun. 26, 2013 in *Otter Products, LLC* v. *Mophie, LLC*, Case No. 1:2012-CV-01969 in the United States District Court for the District of Colorado.
*Incase Designs, Inc.* v. *Mophie, Inc.*, Case No. 3:2013-CV-00602 in the United States District Court for the Northern District of California, filed Feb. 12, 2013 (Docket).
Mophie's Amended Answer and Counterclaims, filed May 8, 2013 in *Incase Designs, Inc.* v. *Mophie, Inc.*, Case No. 3:2013-CV-00602 in the United States District Court for the Northern District of California.
Mophie's Opposition to Motion to Strike Amended Affirmative Defenses, Filed Jun. 12, 2013 in *Incase Designs, Inc.* v. *Mophie, Inc.*, Case No. 3:2013-CV-00602 in the United States District Court for the Northern District of California.
Mophie's Reply in Support of Motion to Stay and Supporting Declaration, filed Sep. 3, 2103 in *Incase Designs, Inc.* v. *Mophie, Inc.*, Case No. 3:2013-CV-00602 in the United States District Court for the Northern District of California.
*Incase Designs, Inc.* v. *Mophie, Inc.*, Case No. 3:2013-CV-03356 in the United States District Court for the Northern District of California, filed Jul. 18, 2013 (Docket).

*Incase Designs, Corp.* v. *Mophie, Inc.*, Case No. 3:2013-CV-04314 in the United States District Court for the Northern District of California, filed Sep. 18, 2013 (Docket).
Mophie Motion 1—To Be Accorded Benefit, filed Nov. 20, 2013 in Patent Interference No. 105,946(RES).
Declaration of John Feland, Ph.D, In Support of Mophie Motion 1 to be Accorded Benefit, dated Nov. 20, 2013, in Patent Interference No. 105,946(RES).
Mophie Motion 2—For Judgment that Incase's Involved Claims are Unpatentable, filed Nov. 20, 2013 in Patent Interference No. 105,946(RES).
Declaration of John Feland, Ph.D, In Support of Mophie Motion 2 for Judgement That Incase's Involved Claims are Unpatentable, dated Nov. 20, 2013, in Patent Interference No. 105,946(RES).
Incase Motion 1—Motion for Benefit, filed Nov. 20, 2013 in Patent Interference No. 105,946(RES).
Incase Motion 2—Motion to Undesignate Claims, filed Nov. 20, 2013 in Patent Interference No. 105,946(RES).
Incase Motion 3—Motion for Judgment Based on Lack of Written Description, filed Nov. 20, 2013 in Patent Interference No. 105,946(RES).
Incase Motion 4—Motion for Unpatentability of Mophie Claims, filed Nov. 20, 2013 in Patent Interference No. 105,946(RES).
Declaration of Andrew Wolfe, filed Nov. 20, 2013 in Patent Interference No. 105,946(RES).
Declaration of Thomas Overthun, filed Nov. 20, 2013 in Patent Interference No. 105,946(RES).
Declaration of Gabriel Dan, filed Nov. 20, 2013 in Patent Interference No. 105,946(RES).
Mophie's Third Amended Complaint, filed Jun. 27, 2014, in *Mophie, Inc.* v. *Source Vista*, Case No. 8:13-CV-01321 in the United States District Court for the Central District of California.
LivingSocial's Answer to Mophie's Fifth Amended Complaint and Counterclaims, filed Sep. 24, 2014, in *Mophie, Inc.* v. *Source Vista*, Case No. 8:13-CV-01321 in the United States District Court for the Central District of California.
Shah's Answer, Affirmative Defenses, and Counterclaims to Plaintiff's Fifth Amended Complaint, filed Sep. 24, 2014, in *Mophie, Inc.* v. *Source Vista*, Case No. 8:13-CV-01321 in the United States District Court for the Central District of California.
Expert Report of Dr. David Munson, dated Aug. 28, 2014, in *Mophie, Inc.* v. *Source Vista*, Case No. 8:13-CV-01321 in the United States District Court for the Central District of California.
Expert Report of John Feland, Ph.D, dated Aug. 28, 2014, in *Mophie, Inc.* v. *Source Vista*, Case No. 8:13-CV-01321 in the United States District Court for the Central District of California.
Rebutal Expert Report of John Feland, Ph.D, dated Sep. 25, 2014, in *Mophie, Inc.* v. *Source Vista*, Case No. 8:13-CV-01321 in the United States District Court for the Central District of California.
Rebutal Expert Report of Dr. David Munson, dated Sep. 25, 2014, in *Mophie, Inc.* v. *Source Vista*, Case No. 8:13-CV-01321 in the United States District Court for the Central District of California.
Mophie's Second Amended Response to LivingSocial's Interrogatory No. 1[21], dated Aug. 28, 2014, in *Mophie, Inc.* v. *Source Vista*, Case No. 8:13-CV-01321 in the United States District Court for the Central District of California.
Mophie's Second Amended Response to Serve Global's Interrogatory No. 2, dated Aug. 28, 2014, in *Mophie, Inc.* v. *Source Vista*, Case No. 8:13-CV-01321 in the United States District Court for the Central District of California.
Defendant's Memorandum in Support of Motion for Partial Summary Judgement, dated Sep. 23, 2014, in *Mophie, Inc.* v. *Source Vista*, Case No. 8:13-CV-01321 in the United States District Court for the Central District of California.
Declaration of David Munson in Support of Defendant's Motion for Partial Summary Judgment, dated Sep. 22, 2014, in *Mophie, Inc.* v. *Source Vista*, Case No. 8:13-CV-01321 in the United States District Court for the Central District of California.
John Feland, Ph.D. Deposition Transcript, dated Sep. 30, 2014, in *Mophie, Inc.* v. *Source Vista*, Case No. 8:13-CV-01321 in the United States District Court for the Central District of California.

(56) References Cited

OTHER PUBLICATIONS

Matthew Brand Deposition Transcript, dated Jul. 23, 2014, in *Mophie, Inc. v. Source Vista*, Case No. 8:13-CV-01321 in the United States District Court for the Central District of California.
Dharmesh Shah Deposition Transcript, dated Jul. 11, 2014, in *Mophie, Inc. v. Source Vista*, Case No. 8:13-CV-01321 in the United States District Court for the Central District of California.
Defendants' Statement of Uncontroverted Material Fact and Contentions of Law, filed Sep. 22, 2014 in *Mophie, Inc. v. Source Vista*, Case No. 8:13-CV-01321 in the United States District Court for the Central District of California.
Memorandum of Points and Authorities in Support of Mophie's Motion for Summary Judgment, filed Sep. 22, 2014, in *Mophie, Inc. v. Source Vista*, Case No. 8:13-CV-01321 in the United States District Court for the Central District of California.
Statement of Uncontroverted Facts and Conclusions of Law in Support of Mophie's Motion for Summary Judgment, filed Sep. 22, 2014, in *Mophie, Inc. v. Source Vista*, Case No. 8:13-CV-01321 in the United States District Court for the Central District of California.
Mophie's Opposition to Shah and Serve Global's Motion for Partial Summary Judgment, dated Oct. 3, 2014, in *Mophie, Inc. v. Source Vista*, Case No. 8:13-CV-01321 in the United States District Court for the Central District of California.
Statement of Genuine Disputes of Material Fact in Opposition to Shah and Serve Global's Motion for Partial Summary Judgment, filed Oct. 3, 2014, in *Mophie, Inc. v. Source Vista*, Case No. 8:13-CV-01321 in the United States District Court for the Central District of California.
Opposition of LivingSocial to Mophie's Motion for Summary Judgment, dated Oct. 3, 2014, in *Mophie, Inc. v. Source Vista*, Case No. 8:13-CV-01321 in the United States District Court for the Central District of California.
Defendants' Opposition to Plaintiff's Motion for Summary Judgment, filed Oct. 3, 2014, in *Mophie, Inc. v. Source Vista*, Case No. 8:13-CV-01321 in the United States District Court for the Central District of California.
Defendants' Response to Plaintiffs Statement of Uncontroverted Material Fact and Contentions of Law, filed Oct. 3, 2014, in *Mophie, Inc. v. Source Vista*, Case No. 8:13-CV-01321 in the United States District Court for the Central District of California.
David Munson Deposition Transcript, dated Sep. 29, 2014, in *Mophie, Inc. v. Source Vista*, Case No. 8:13-CV-01321 in the United States District Court for the Central District of California.
Mophie's First Amended Complaint, filed Jun. 25, 2014, in *Mophie, Inc. v. UNU Electronics Inc.*, Case No. 8:13-CV-01705 in the United States District Court for the Central District of California.
UNU's Answer and Counterclaims, filed Jul. 10, 2014, in *Mophie, Inc. v. UNU Electronics Inc.*, Case No. 8:13-CV-01705 in the United States District Court for the Central District of California.
Mophie's Responses to Defendant's Third Set of Interrogatories (No. 12), dated Aug. 21, 2014, in *Mophie, Inc. v. UNU Electronics Inc.*, Case No. 8:13-CV-01705 in the United States District Court for the Central District of California.
Mophie's Responses to Defendant's First set of Requests for Admissions (Nos. 1-46), dated Aug. 19, 2014, in *Mophie, Inc. v. UNU Electronics Inc.*, Case No. 8:13-CV-01705 in the United States District Court for the Central District of California.
Mophie's Responses to Defendant's Second set of Requests for Admissions (Nos. 47-109), dated Aug. 19, 2014, in *Mophie, Inc. v. UNU Electronics Inc.*, Case No. 8:13-CV-01705 in the United States District Court for the Central District of California.
Request for Ex Parte Reexamination of U.S. Patent No. 8,367,235, filed Aug. 14, 2014.
Corrected Request for Ex Parte Reexamination of U.S. Patent No. 8,367,235, filed Sep. 18, 2014.
Declaration of John Feland, Ph.D. In Support of Mophie's Opposition to Defendants Motion for Partial Summary Judgment, filed Oct. 3, 2014, in *Mophie, Inc. v. Source Vista*, Case No. 8:13-CV-01321 in the United States District Court for the Central District of California.
LivingSocial's Reply in Support of Motion for Summary Judgment, Filed Oct. 10, 2014, in *Mophie, Inc. v. Source Vista*, Case No. 8:13-CV-01321 in the United States District Court for the Central District of California.
Defendants' Reply in Support of Motion for Partial Summary Judgment, Filed Oct. 10, 2014, in *Mophie, Inc. v. Source Vista*, Case No. 8:13-CV-01321 in the United States District Court for the Central District of California.
Reply in Support of Mophie's Motion for Summary Judgment, Filed Oct. 10, 2014, in *Mophie, Inc. v. Source Vista*, Case No. 8:13-CV-01321 in the United States District Court for the Central District of California.
Mophie's Reply to Counterclaims of LivingSocial, filed Oct. 14, 2014, in *Mophie, Inc. v. Source Vista*, Case No. 8:13-CV-01321 in the United States District Court for the Central District of California.
Mophie's Reply to Counterclaims of Shah, filed Oct. 14, 2014, in *Mophie, Inc. v. Source Vista*, Case No. 8:13-CV-01321 in the United States District Court for the Central District of California.
Defendant's Response to Mophie's Fourth Set of Interrogatories, dated Sep. 23, 2014, in *Mophie, Inc. v. UNU Electronics Inc.*, Case No. 8:13-CV-01705 in the United States District Court for the Central District of California.
Plaintiff Mophie's Preliminary Claim Constructions and Identification of Extrinsic Evidence, dated Oct. 14, 2014, in *Mophie, Inc. v. UNU Electronics Inc.*, Case No. 8:13-CV-01705 in the United States District Court for the Central District of California.
Defendant's Preliminary Claim Constructions and Extrinsic Evicence, dated Oct. 14, 2014, in *Mophie, Inc. v. UNU Electronics Inc.*, Case No. 8:13-CV-01705 in the United States District Court for the Central District of California.
Plaintiff Mophie's Opening Brief on Claim Construction, filed Oct. 29, 2014, in *Mophie, Inc. v. UNU Electronics Inc.*, Case No. 8:13-CV-01705 in the United States District Court for the Central District of California.
Declaration of John Feland, Ph.D. In Support of Plaintiffs Preliminary Claim Constructions, filed Oct. 29, 2014, in *Mophie, Inc. v. UNU Electronics Inc.*, Case No. 8:13-CV-01705 in the United States District Court for the Central District of California.
Supplemental Declaration of John Feland, Ph.D. In Support of Plaintiffs Claim Constructions, filed Oct. 29, 2014, in *Mophie, Inc. v. UNU Electronics Inc.*, Case No. 8:13-CV-01705 in the United States District Court for the Central District of California.
Declaration of Sheila N. Swaroop in Support of Mophie's Opening Claim Construction Brief, filed Oct. 29, 2014, in *Mophie, Inc. v. UNU Electronics Inc.*, Case No. 8:13-CV-01705 in the United States District Court for the Central District of California.
Transcript of Deposition of John Feland, dated Oct. 21, 2014, in *Mophie, Inc. v. UNU Electronics Inc.*, Case No. 8:13-CV-01705 in the United States District Court for the Central District of California.
Defendant's Opening Claim Construction Brief, dated Oct. 29, 2014, in *Mophie, Inc. v. UNU Electronics Inc.*, Case No. 8:13-CV-01705 in the United States District Court for the Central District of California.
Order Granting Request for Ex Parte Reexamination of U.S. Patent. No. 8,367,235, in Reexamination Control No. 90/013,319, dated Oct. 24, 2014.
Order Re LivingSocial's Motion for Summary Judgment, Mophie's Motion for Summary Judgment, Source Vista and Shah's Motion for Partial Summary Judgment, and Mophie's Motion to Bifurcate, dated Nov. 12, 2014, in *Mophie, Inc. v. Source Vista*, Case No. 8:13-CV-01321 in the United States District Court for the Central District of California.
Mophie's Memorandum in Support of its Motion for Reconsideration, filed Nov. 19, 2014, in *Mophie, Inc. v. Source Vista*, Case No. 8:13-CV-01321 in the United States District Court for the Central District of California.
Declaration of Sheila N. Swaroop in Support of Mophie's Motion for Reconsideration, filed Nov. 19, 2014, in *Mophie, Inc. v. Source Vista*, Case No. 8:13-CV-01321 in the United States District Court for the Central District of California.
Order Denying Plantiff's Motion for Reconsideration, dated Nov. 21, 2014, in *Mophie, Inc. v. Source Vista*, Case No. 8:13-CV-01321 in the United States District Court for the Central District of California.

(56) References Cited

OTHER PUBLICATIONS

International Preliminary Report on Patentability for PCT/US2013/057276, dated Mar. 3, 2015.
International Search Report and Written Opinion for PCT/US2014/067470, dated Mar. 31, 2015.
Defendants Dharmesh Shah and Serve Global, LLC's Memorandum of Points and Authorities in Support of Defendants's Motion for Attorney's Fees, filed Mar. 21, 2015, in *Mophie, Inc. v. Source Vista*, Case No. 8:13-CV-01321 in the United States District Court for the Central District of California.
Memorandum of Points and Authorities in Support of Livingsocial, Inc.'s Motion for Legal Fees and Costs, filed Mar. 20, 2015, in *Mophie, Inc. v. Source Vista*, Case No. 8:13-CV-01321 in the United States District Court for the Central District of California.
Plaintiff Mophie, Inc.'s Opposition to Defendants Dharmesh Shah and Serve Global, LLC's Motion for Attorneys' Fees, filed Apr. 3, 2015, in *Mophie, Inc. v. Source Vista*, Case No. 8:13-CV-01321 in the United States District Court for the Central District of California.
Plaintiff Mophie, Inc.'s Opposition to Defendant Livingsocial, Inc.'s Motion for Attorneys' Fees, filed Apr. 3, 2015, in *Mophie, Inc. v. Source Vista*, Case No. 8:13-CV-01321 in the United States District Court for the Central District of California.
Reply to Plaintiff's Opposition to Defendants Dharmesh Shah and Serve Global, LLC's Motion for Attorney's Fees, filed Apr. 10, 2015, in *Mophie, Inc. v. Source Vista*, Case No. 8:13-CV-01321 in the United States District Court for the Central District of California.
Reply in Support of Livingsocial, Inc.'s Motion for Legal Fees and Costs, filed Apr. 10, 2015, in *Mophie, Inc. v. Source Vista*, Case No. 8:13-CV-01321 in the United States District Court for the Central District of California.

\* cited by examiner

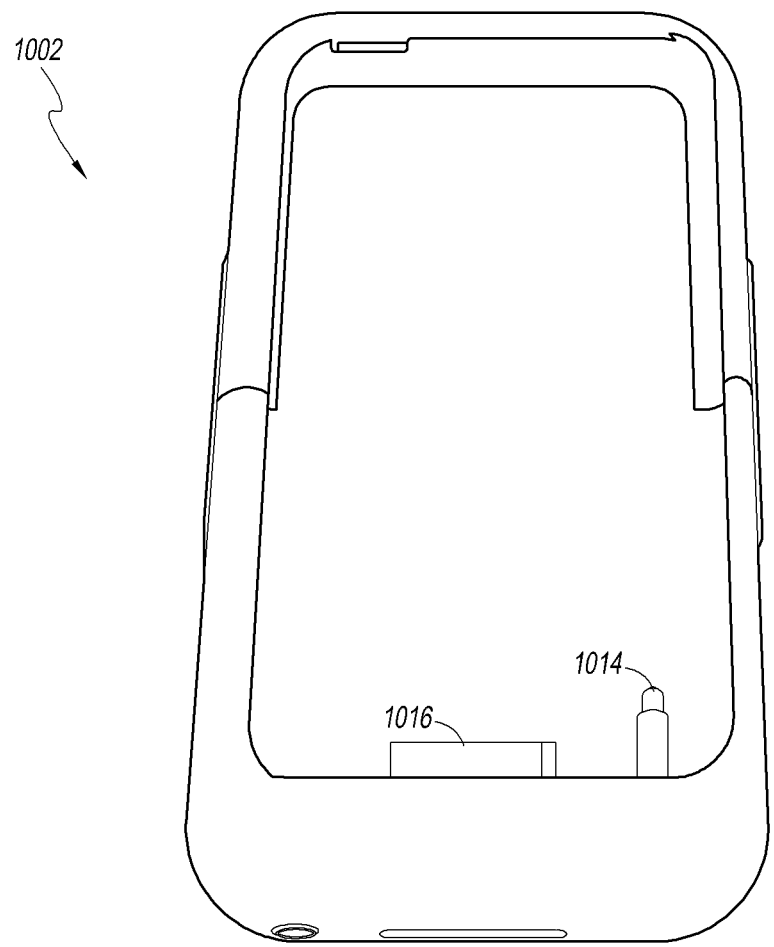
FIG. IIA

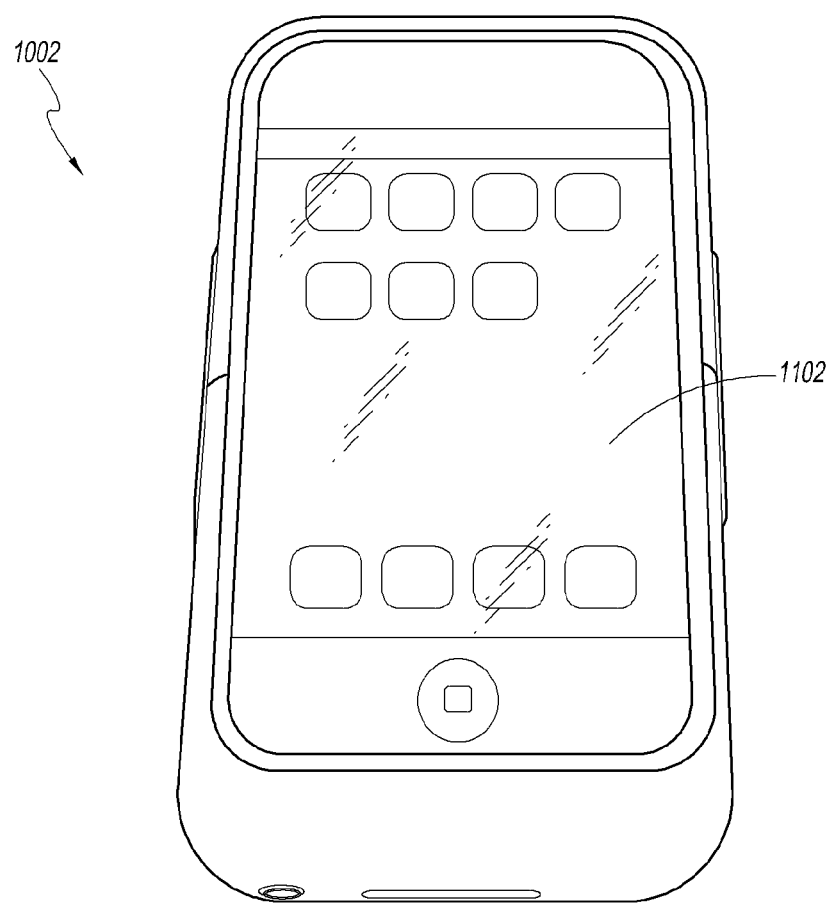
FIG. IIB

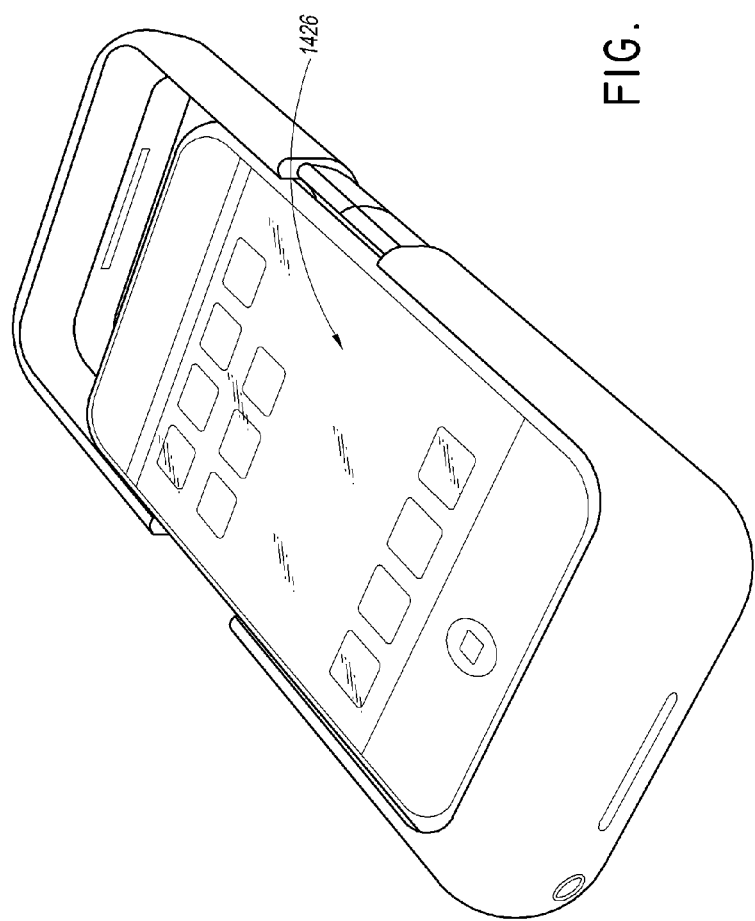

BATTERY PACK, HOLSTER, AND EXTENDIBLE PROCESSING AND INTERFACE PLATFORM FOR MOBILE DEVICES

CROSS-REFERENCE TO RELATED APPLICATIONS

This application is a continuation of U.S. patent application Ser. No. 12/938,351, titled BATTERY PACK, HOLSTER, AND EXTENDIBLE PROCESSING AND INTERFACE PLATFORM FOR MOBILE DEVICES, filed on Nov. 2, 2010, which is a divisional of U.S. patent application Ser. No. 12/357,262, titled BATTERY PACK, HOLSTER, AND EXTENDIBLE PROCESSING AND INTERFACE PLATFORM FOR MOBILE DEVICES, filed on Jan. 21, 2009, which claims the benefit under 35 U.S.C. §119(e) to U.S. Provisional Patent Application No. 61/021,897, titled BATTERY PACK AND HOLSTER FOR MOBILE DEVICES, and filed Jan. 18, 2008, the disclosures of which are hereby expressly incorporated by reference for all purposes.

FIELD

One embodiment relates to battery packs and/or holsters and, more particular, to an external battery pack and/or holster for mobile electronic devices.

BACKGROUND

Many mobile devices (e.g., mobile phones, digital assistants, mobile communication devices, handheld computing devices, personal music/video/content players and storage devices) are often powered by battery power sources. Such battery power sources are often housed within the mobile device and may be changed and/or recharged as needed. However, as more powerful mobile devices are designed, these tend to consume power more quickly, thereby shortening the time between charges. This tends to limit the usefulness of the mobile device since the user must find a power source to recharge the battery source and wait until it is recharged.

Additionally, after a certain number of recharges, a battery source may need to be replaced as it may no longer hold a charge. Oftentimes, it is not easy to replace a battery source as the mobile device may need to be disassembled or opened to reach the battery source.

Therefore, a way is needed to extend the time between charges of mobile devices and/or continue to power the mobile device even after an internal power source has been depleted.

SUMMARY

One embodiment relates to battery packs and/or holsters and, more particular, to an external battery pack and/or holster for mobile electronic devices.

BRIEF DESCRIPTION OF THE DRAWINGS

FIGS. 10-13 illustrate an alternative embodiment of a battery pack.

DETAILED DESCRIPTION

In the following detailed description of the invention, numerous specific details are set forth in order to provide a thorough understanding of the invention. However, the invention may be practiced without these specific details. In other instances, well known methods, procedures, and/or components have not been described in detail so as not to unnecessarily obscure aspects of the invention.

Various embodiments provide battery packs shaped to conform to the external shape of a mobile device, thereby providing a permanent replacement power source without significantly affecting the size and usability of the mobile device.

First Embodiment

Figure 1:
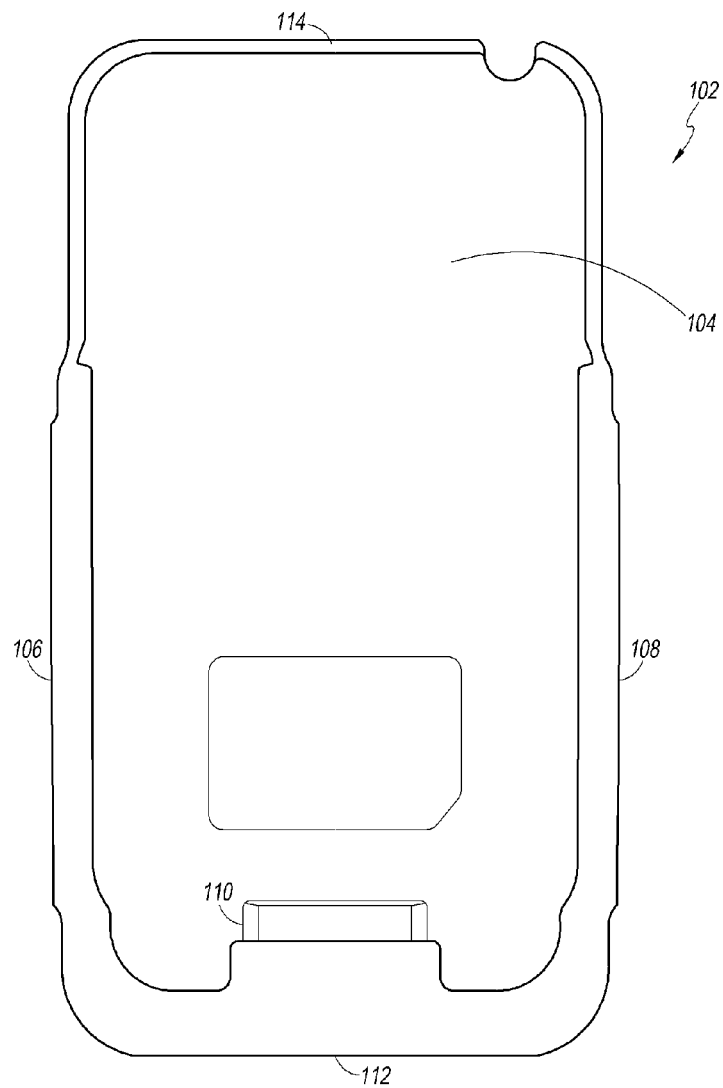
FIGS. 1-5 illustrate one example of a battery pack for a mobile device.

FIGS. 1-5 illustrate one example of a battery pack for a mobile device. FIG. 1 illustrates a front view of the battery pack 102 includes a back plane 104, first and second sides 106 and 108, and a bottom side 112. The back plane 104, first and second sides 106 and bottom side 112 may be shaped to form a pocket into which a mobile device to be powered can slide. A top portion 114 of the battery pack 102 may remain open to allow insertion and removal of the mobile device. A device interface 110 may be positioned along the bottom side 112 to couple with the mobile device. The device interface 110 may serve for the battery pack 102 to provide power to the mobile device. The battery pack may be detached from the mobile device to be recharged. In some examples, a user may have two battery packs so that when one is being charged, the other can be powering the mobile device.

Figure 2:
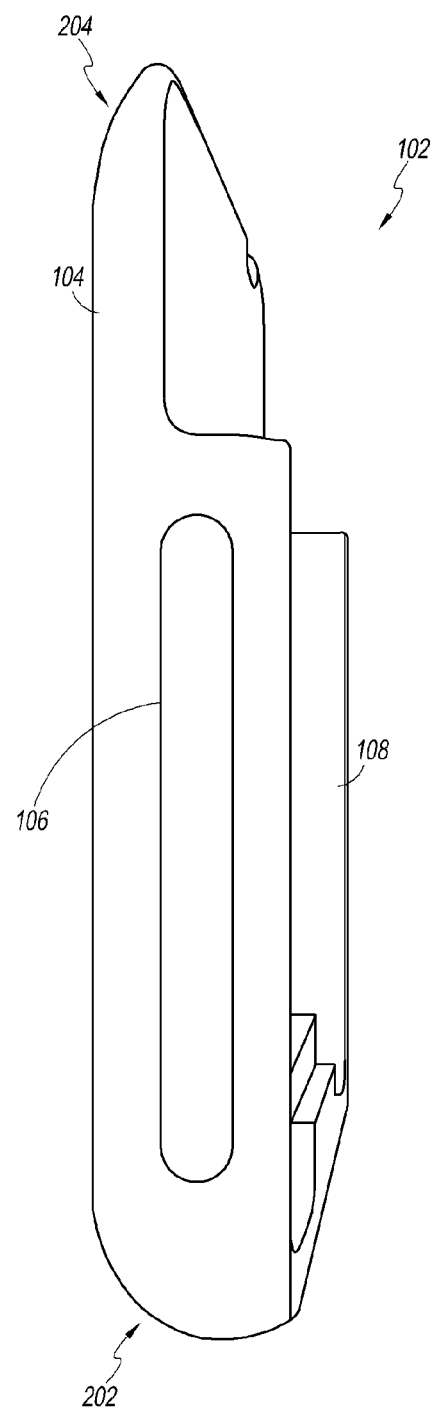

FIG. 2 illustrates a side view of the battery pack 102. The first and second sides 106 and 108 may extend the whole length or a partial length of the battery pack 102. The sides and ends 202 and 204 of the battery pack 102 may be rounded to provide an ergonomic shape. Additionally, internal rechargeable battery cells may be housed within the thickness of the back plane 104. The internal rechargeable battery cells may be coupled to the device interface 110 to provide power to the mobile device.

Figure 3:
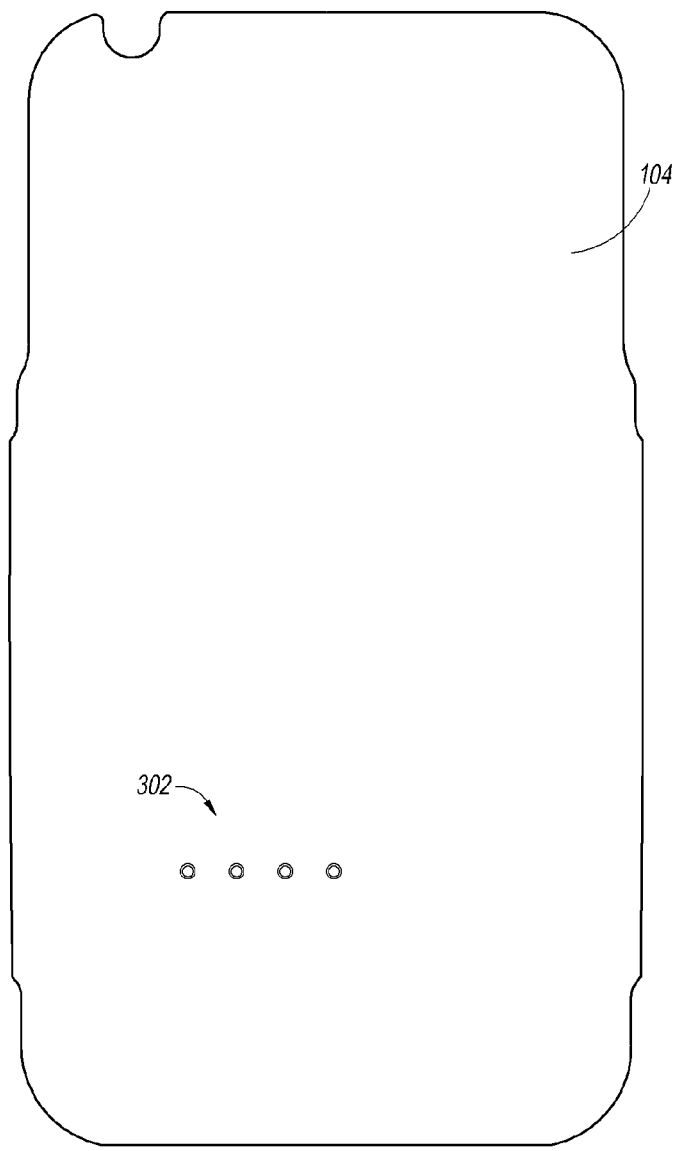

FIG. 3 illustrates a back view of the battery pack 102. The size or dimensions of the back plane 104 may be approximately that of the mobile device to which it is intended to provide power. Additionally, a plurality of LEDs 302 may be mounted on the back surface to indicate the charge status of the internal battery cells of the battery pack 102.

Figure 4:
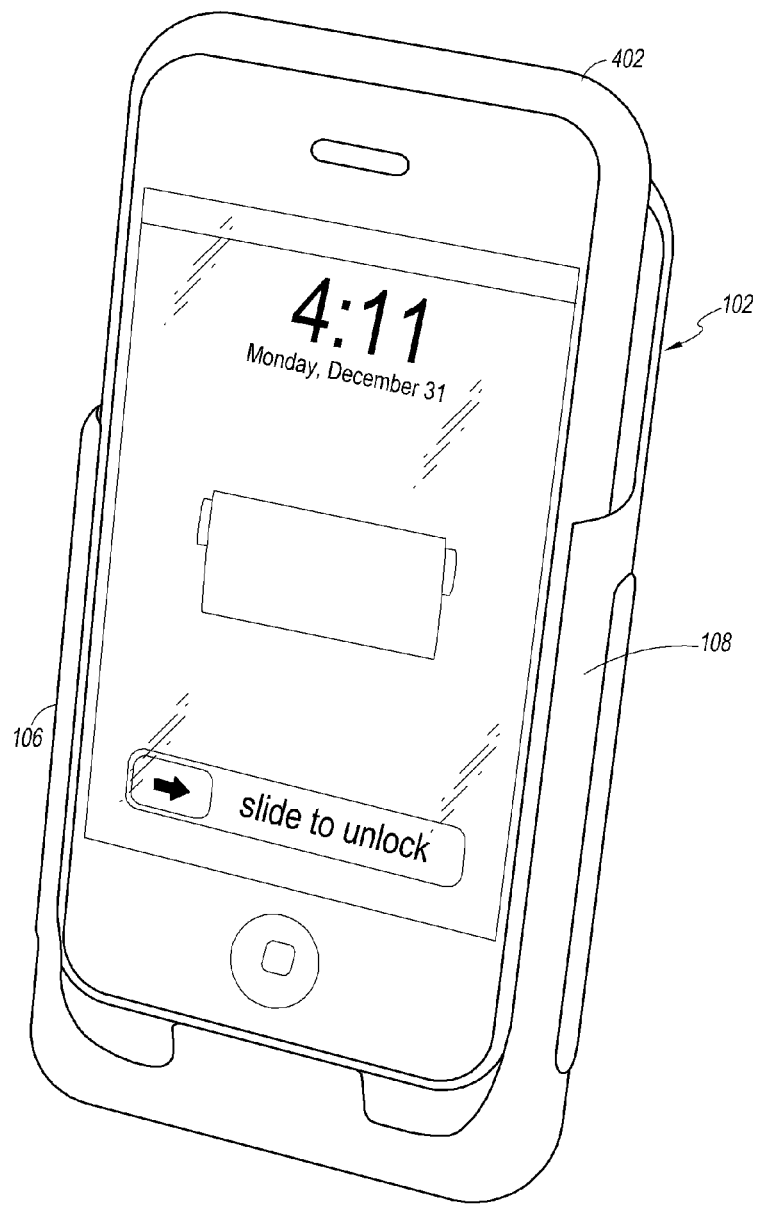
Figure 5:
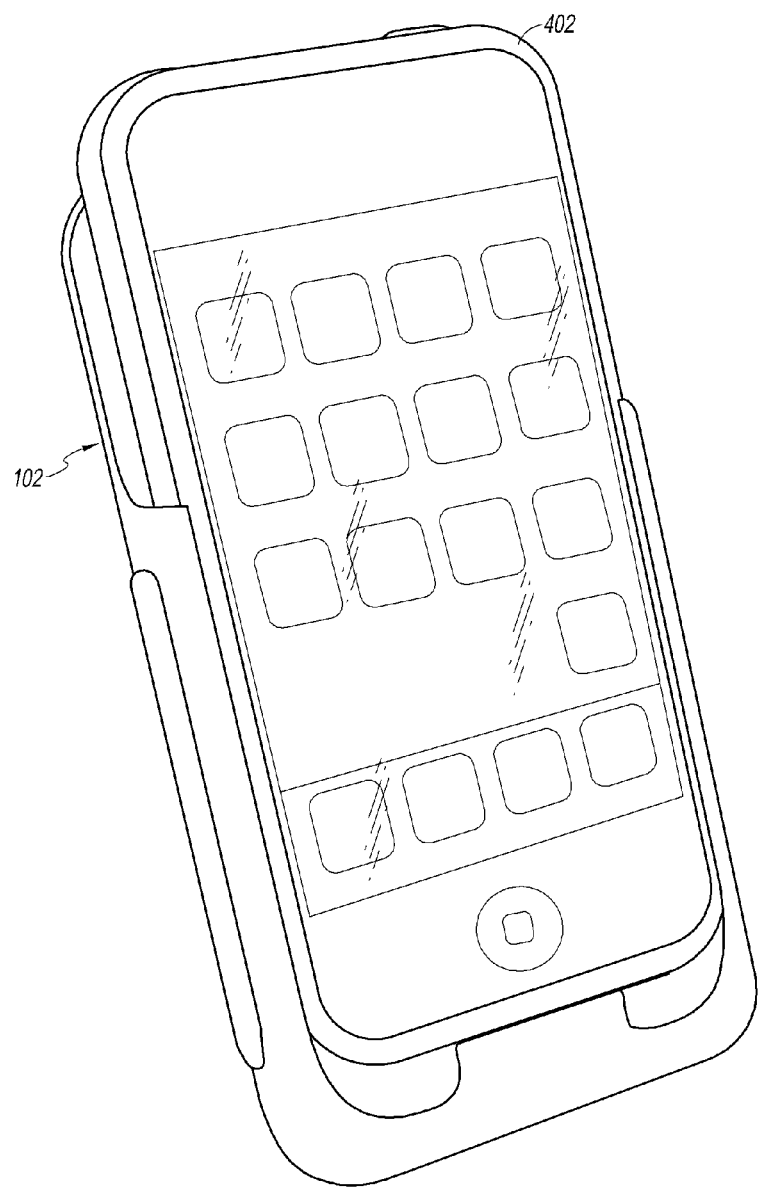
Figure 6:
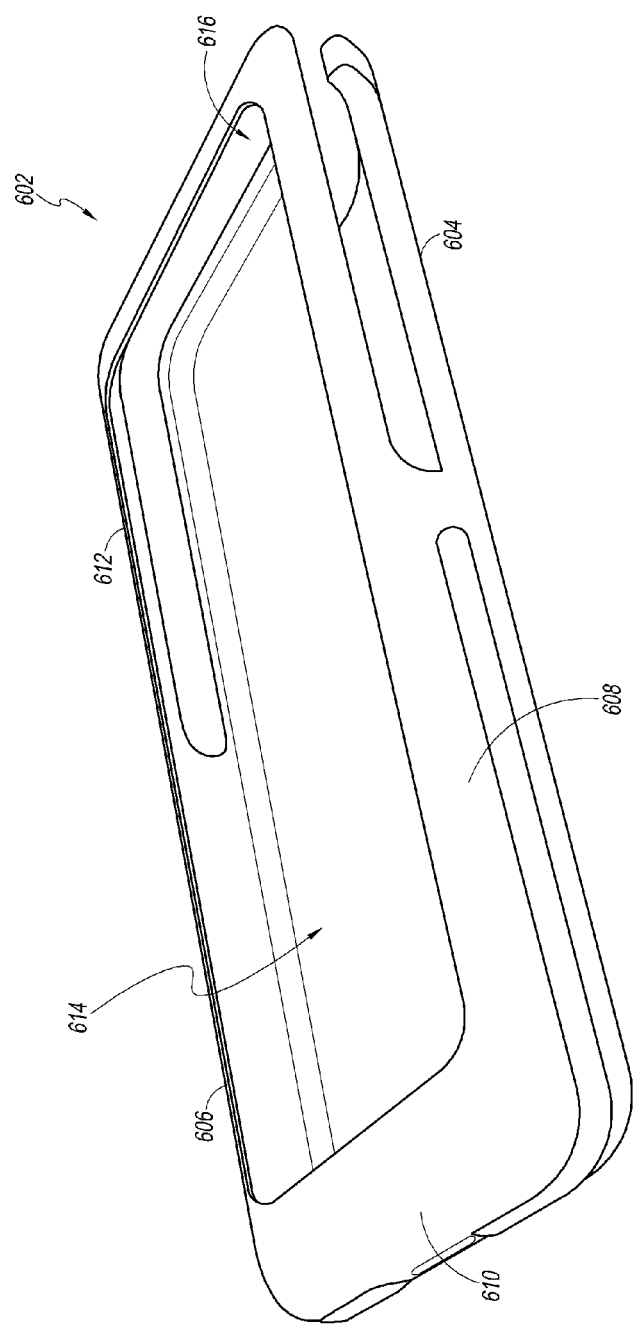
FIGS. 6-9 illustrate an embodiment of a mobile device holster.
Figure 7:
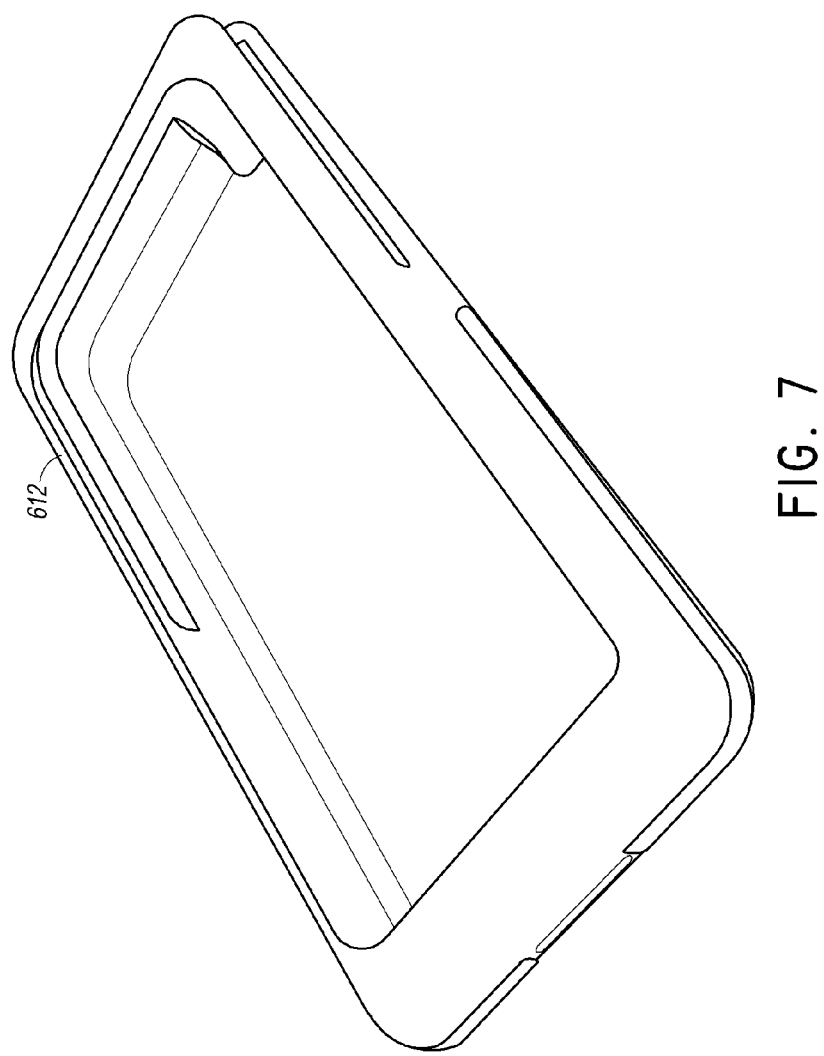
Figure 8:
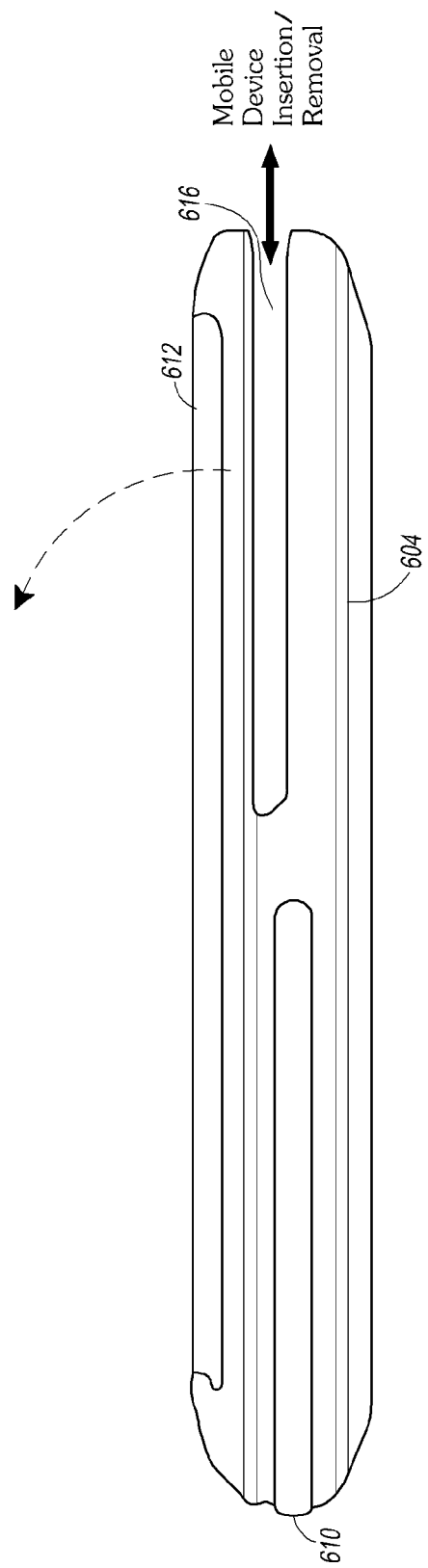

FIGS. 4 and 5 illustrate two different side views of how one type of mobile device 402 (i.e., an iPhone™ by Apple Inc.) may be mounted or coupled to the battery pack 102. The mobile device 402 may slide into the battery pack 102 and may be held in place or attached by the first and second sides 106 and 108 and/or device interface 110.

Second Embodiment

FIGS. 6-9 illustrate an alternative embodiment of a mobile device holster. The holster 602 may include a back plane 604, a first and second sides 606 and 608, a bottom side 610, and an upper flange 612 which define a cavity 614 for housing a mobile device. An opening 616 may be defined between the upper flange 612 and the back plane 604. The upper flange 612 may flex (as denoted in FIG. 8) to allow the mobile device to be inserted through the opening 616 to insert the mobile device. Similarly, the upper flange 612 may flex back to allow the mobile device to be removed. The upper flange 612 and first and second sides 606 and 608 may be shaped to retain the mobile device when inserted into the holster 602. In one example, the holster 602 may include one or more interfaces that couple to the mobile device when the mobile device is housed within the holster. The interface act as a bridge to allow the mobile device to couple to an external device. For instance, the holster 602 may be adapted to be coupled to an external battery pack to provide power to the mobile device.

Figure 9:
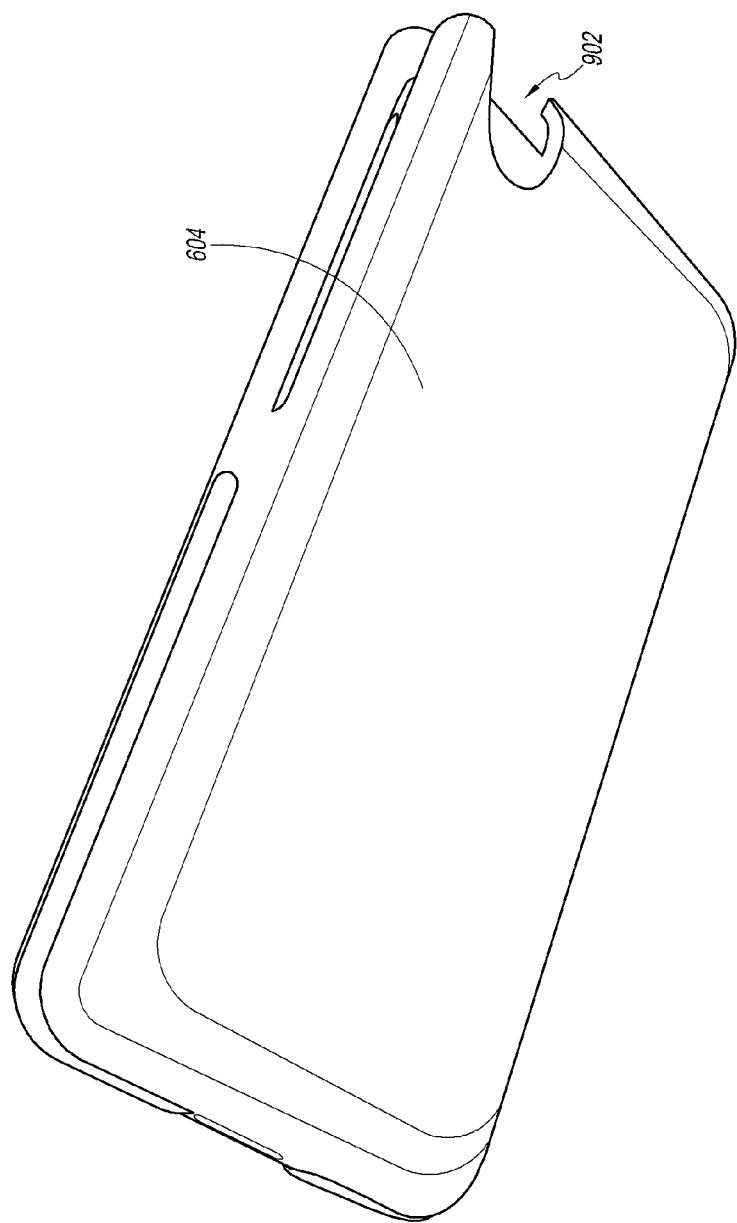
Figure 10:
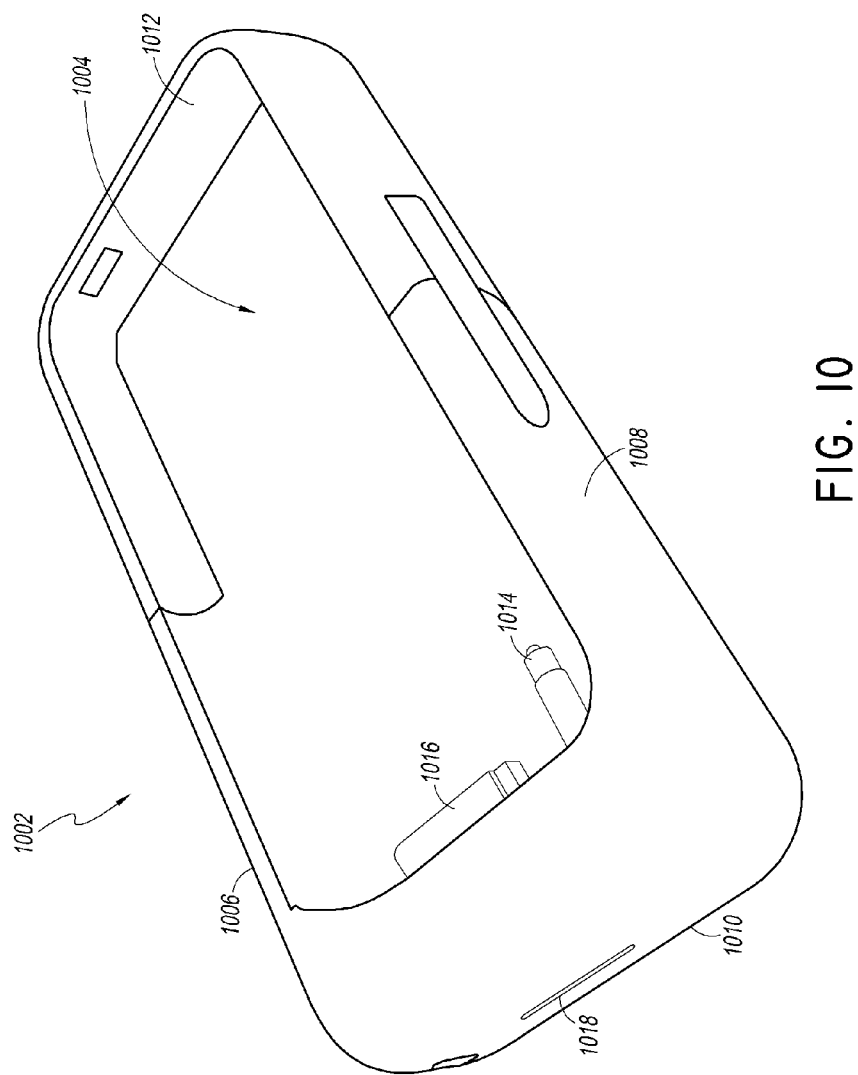

In an alternative embodiment, the holster 602 may also include one or more rechargeable battery cells within the thickness of the back plane 604 that can power the mobile device via a device interface. FIG. 9 illustrates one example of a back view of the holster 612. An opening 902 may be formed on the back plane 604 to allow access to a reset or power button on the mobile device.

Third Embodiment

FIGS. 10-13 illustrate an alternative embodiment of a battery pack. The battery pack 1002 may include a back plane 1004, a first and second sides 1006 and 1008, a bottom side 1010, and an upper side 1012 which define a cavity 1004 for housing a mobile device. Additionally, the battery pack 1002 may include a first device interface 1014 and a second device interface 1016 (e.g., power connector, audio signals, control signal, data signals, etc.). In one embodiment, the second device interface 1016 may serve to provide power from one or more internal power cells (housed within the thickness of the back plane 1004). The internal power cells may be recharged via a third interface 1018 on the battery pack 1002. As illustrated in FIG. 11B, a mobile device 1102 may be inserted and housed by the battery pack 1002.

Figure 12A:
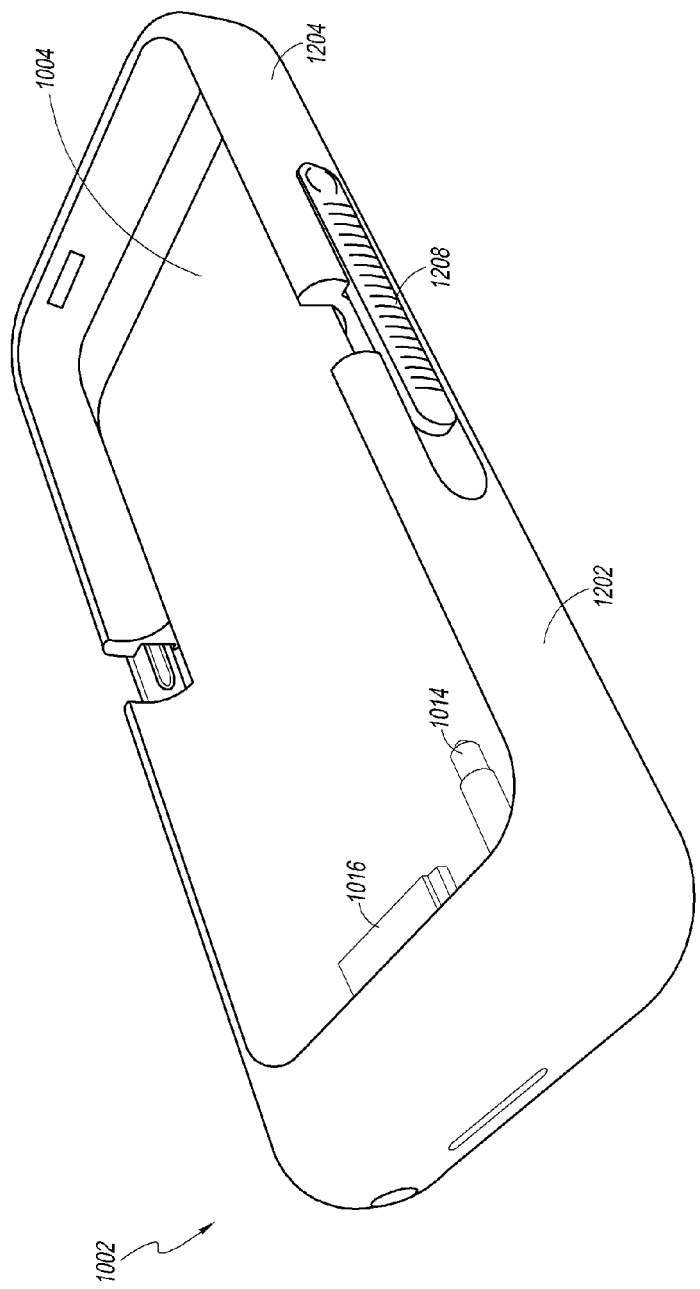
Figure 12B:
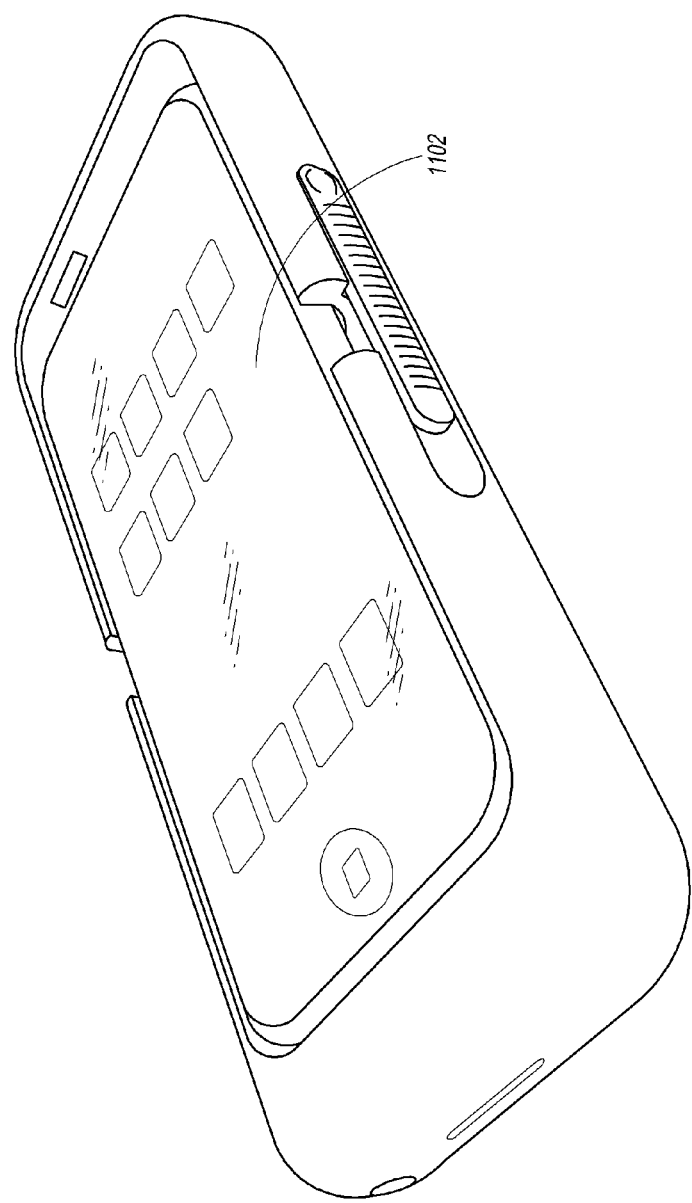
Figure 13A:
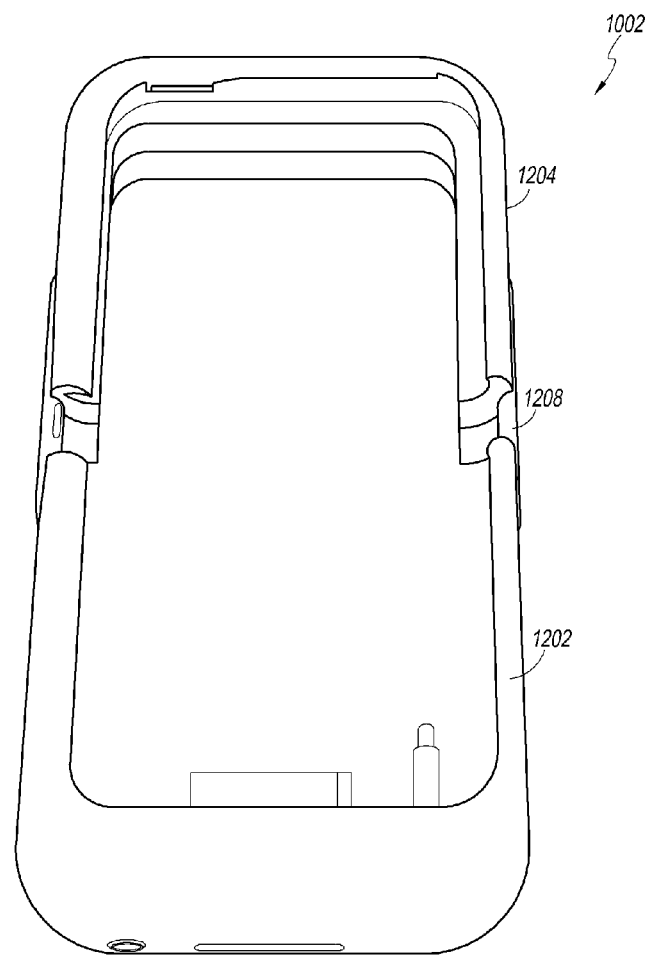
Figure 13B:
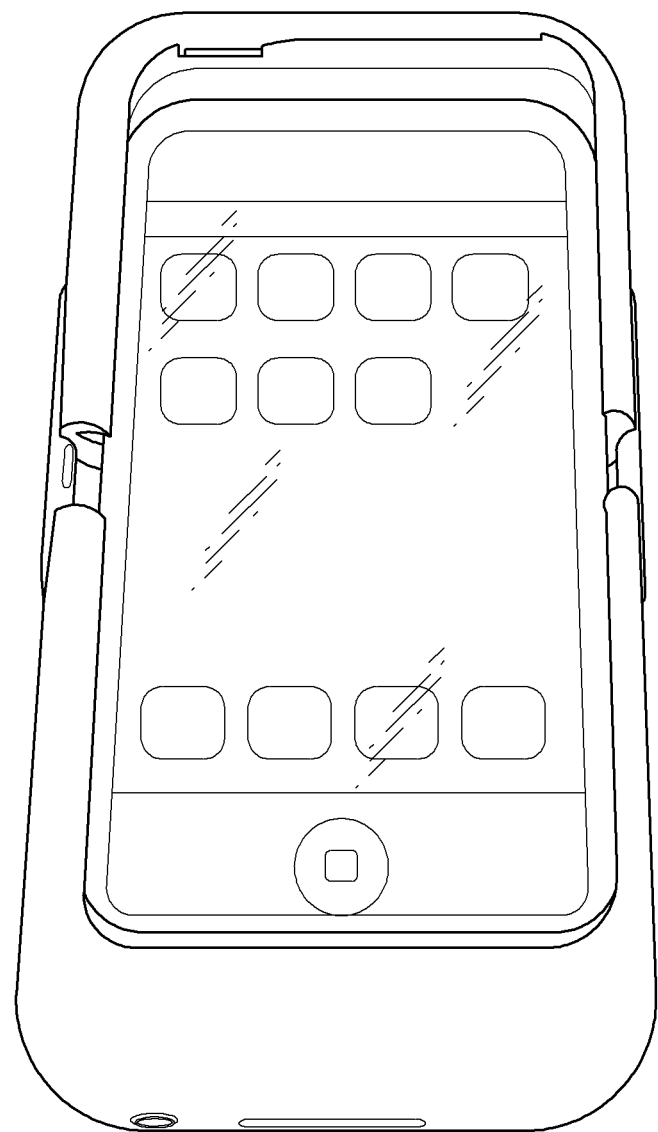
Figure 14A:
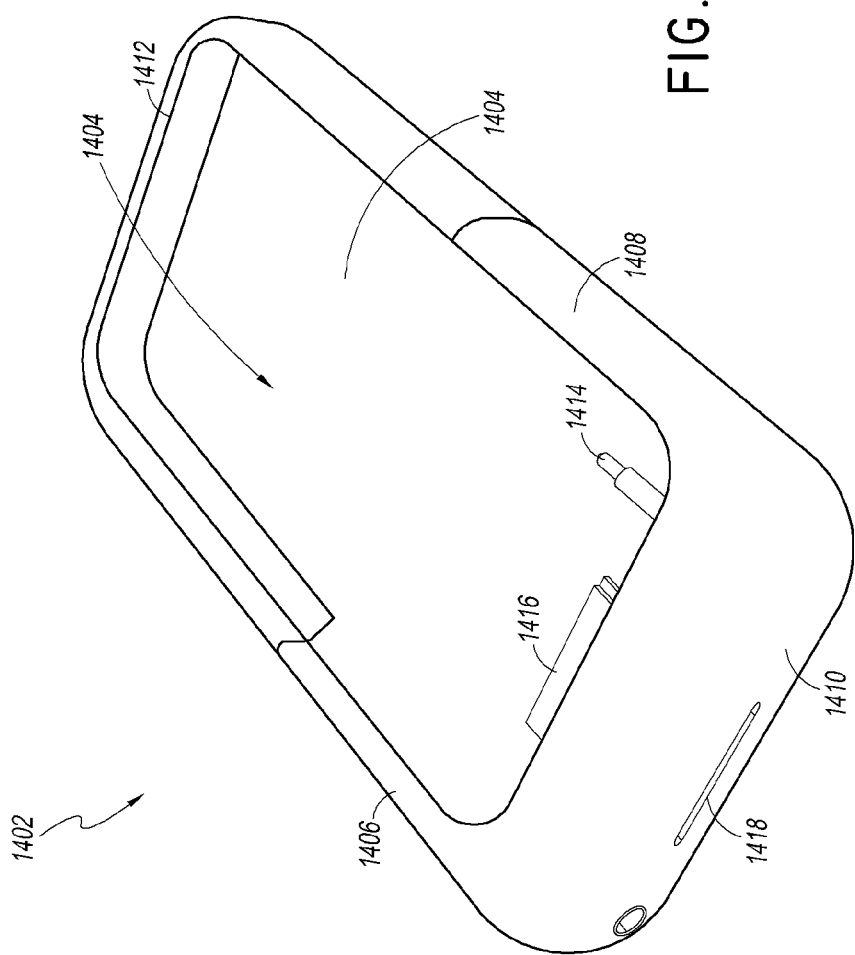
FIGS. 14-18 illustrate an alternative embodiment of a battery pack.
Figure 14B:
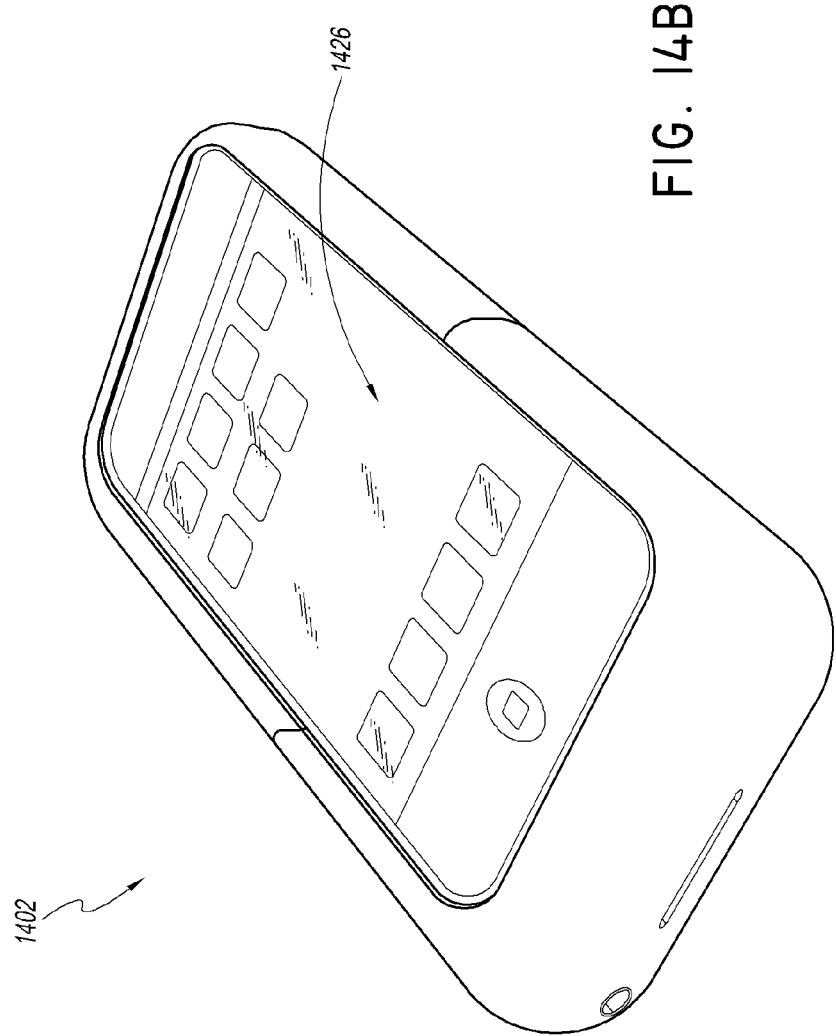
Figure 15A:
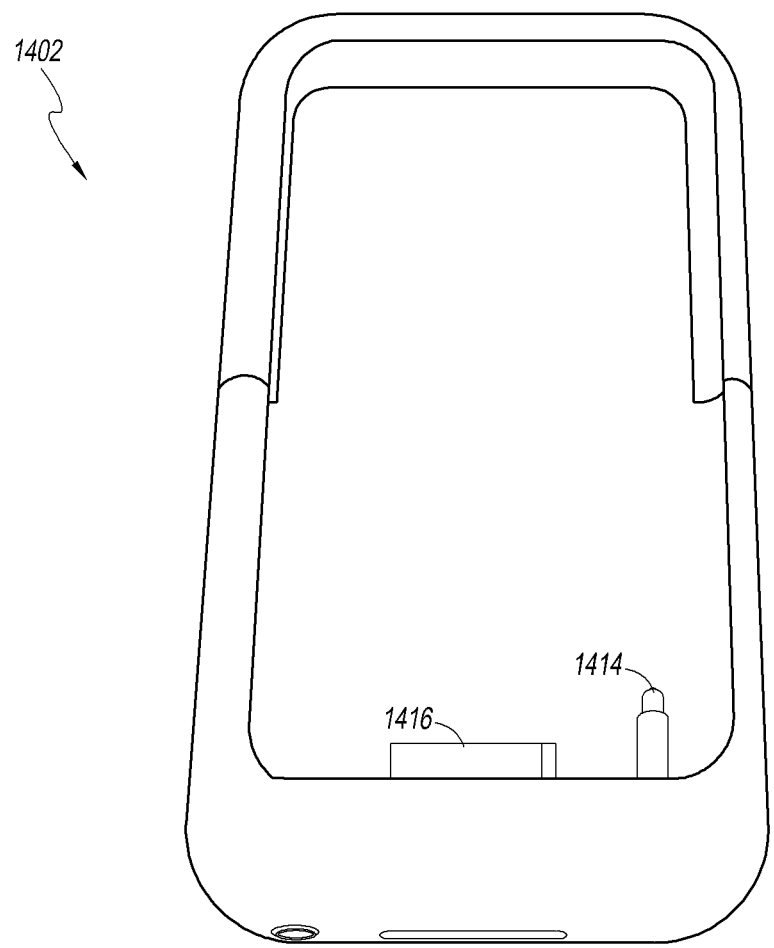
Figure 15B:
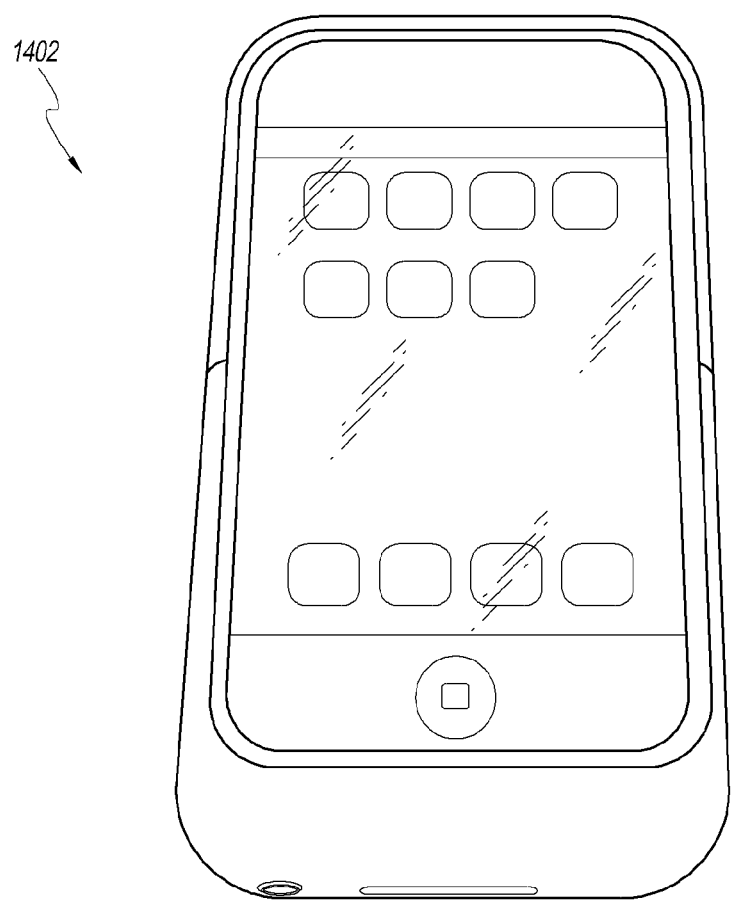

FIGS. 12 and 13 illustrate how the battery pack 1002 may be adapted to allow the mobile device 1102 to be inserted or removed. An upper portion 1204 may be movably separated from a lower portion 1202 of the battery pack 1002. The upper portion 1204 may slide on guides 1208 on both sides to create a space which allows the mobile device 1102 to detach from the interfaces 1014 and/or 1016. Once detached, the mobile device may be removed. Similarly, the space created by the upper portion 1204 sliding away from the bottom portion 1202 allows the mobile device to be inserted into the battery pack 1002.

The guides 1208 may also act as a stopper to prevent the upper portion 1204 from completely separating from the bottom portion 1202 once a separation limit is reached. Similarly, the guides 1208 may also include locking tabs that secure or couple the upper portion 1204 and lower portion 1202 together when they are in a closed position.

Fourth Embodiment

FIGS. 14-18 illustrate an alternative embodiment of a battery pack. The battery pack 1402 may include a back plane 1404, a first and second sides 1406 and 1408, a bottom side 1410, and an upper side 1412 which define a cavity 1404 for housing a mobile device 1426. Additionally, the battery pack 1402 may include a first device interface 1414 and a second device interface 1416 (e.g., power connector, audio signals, control signal, data signals, etc.). In one embodiment, the second device interface 1416 may serve to provide power from one or more internal power cells (housed within the thickness of the back plane 1404). The internal power cells may be recharged via a third interface 1418 on the battery pack 1402. As illustrated in FIG. 14B, a mobile device 1426 may be inserted and housed by the battery pack 1402.

Figure 16A:
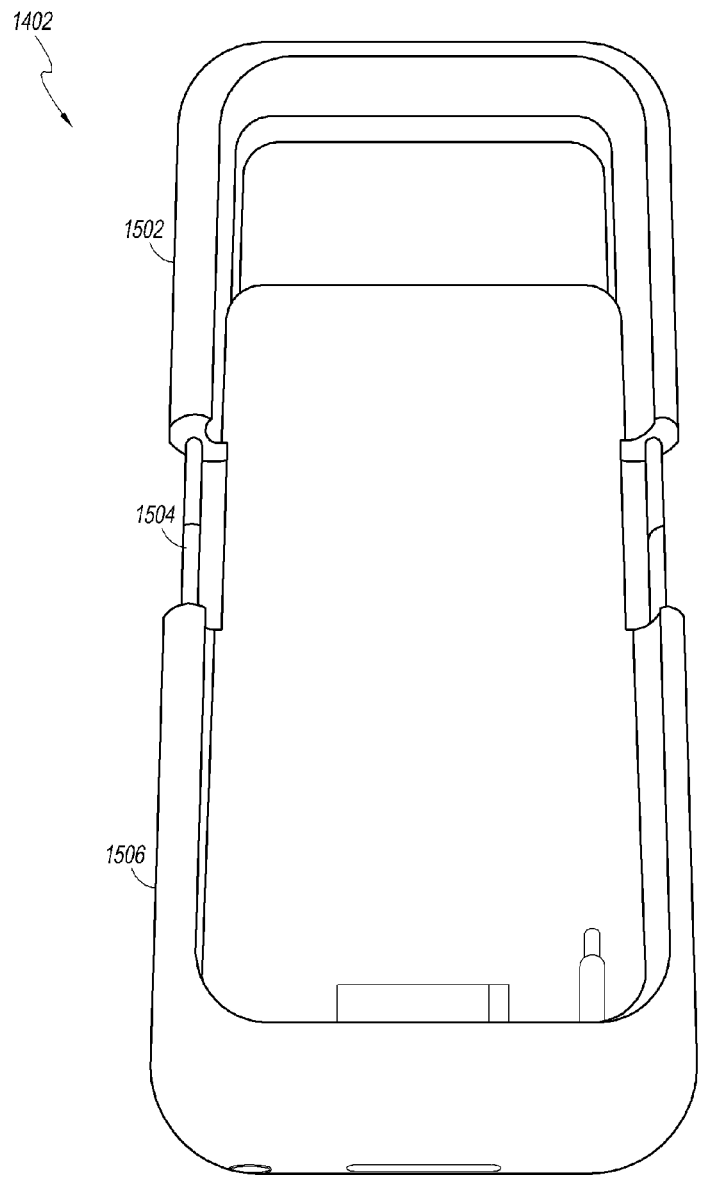
Figure 16B:
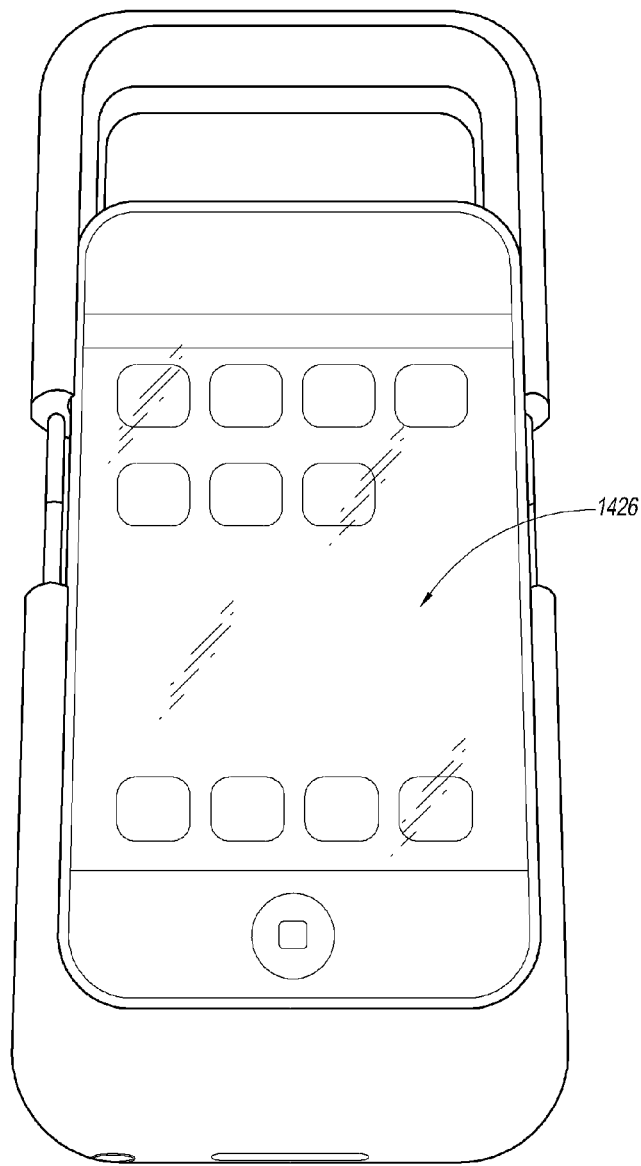
Figure 17A:
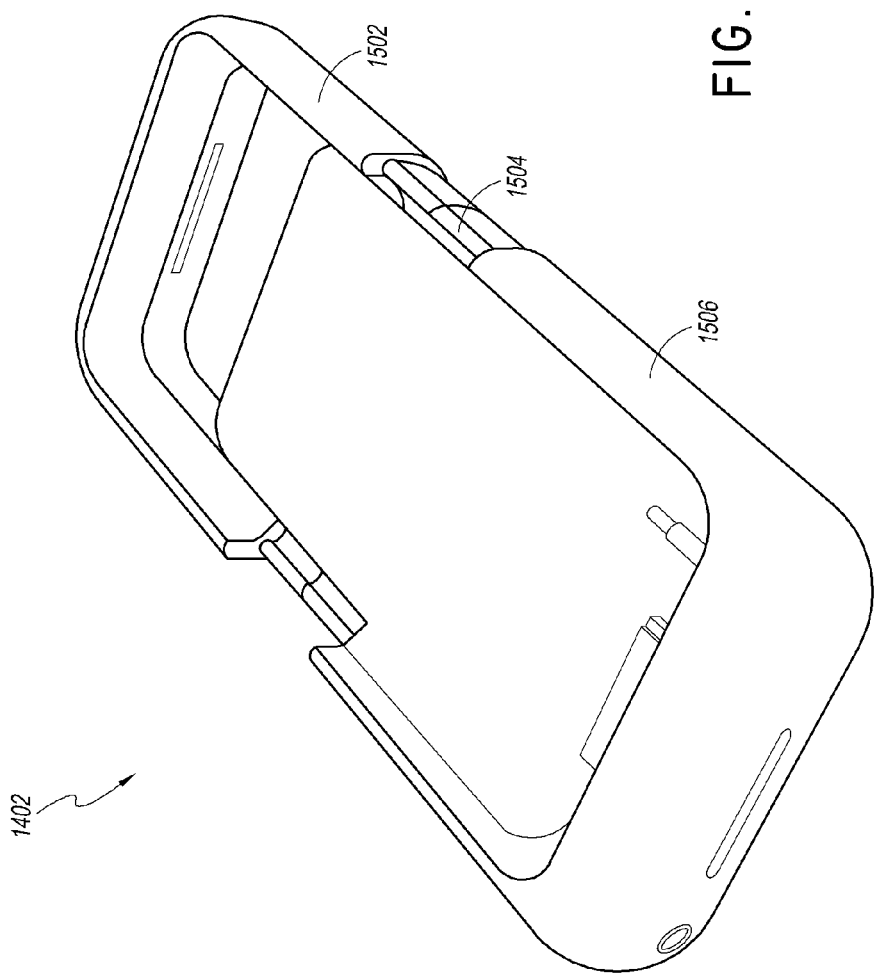
Figure 18B:
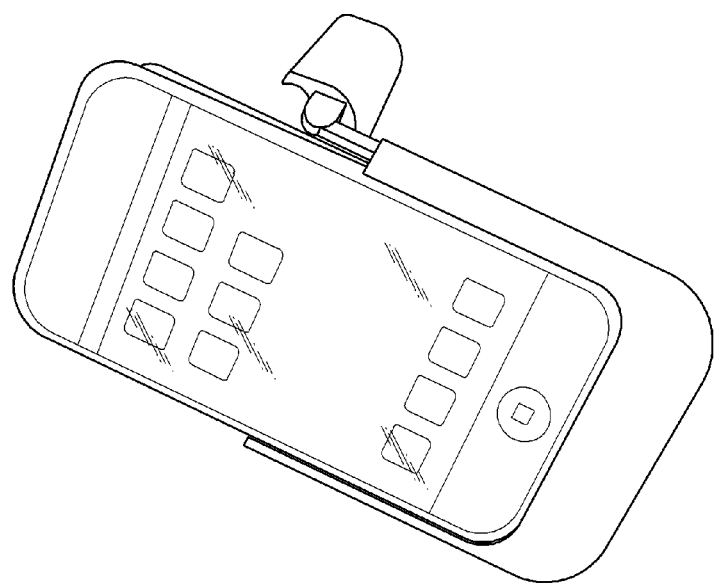
Figure 18A:
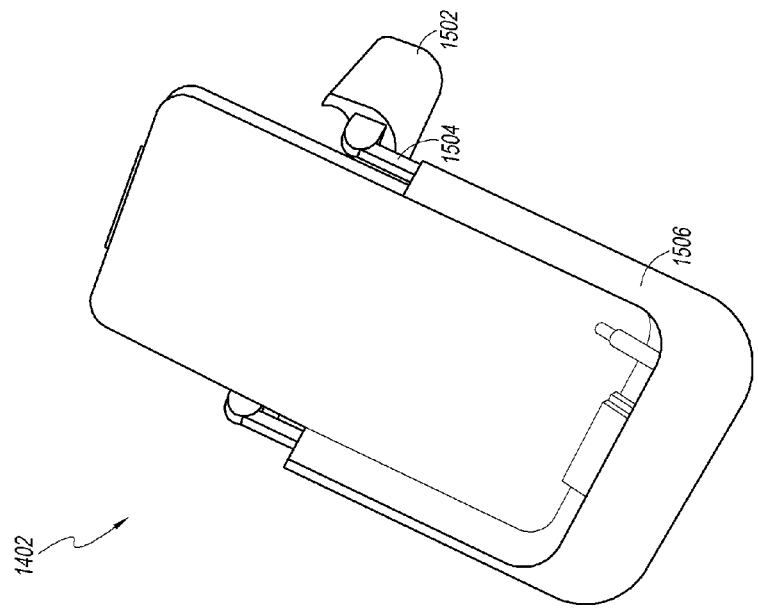

FIGS. 16, 17, and 18 illustrate how the battery pack 1402 may be adapted to allow the mobile device 1426 to be inserted or removed. An upper portion 1502 may be movably separated from a lower portion 1506 of the battery pack 1402. The upper portion 1502 may slide on guides 1504 on both sides to create a space which allows the mobile device 1426 to detach from the interfaces 1414 and/or 1416. Once detached, the mobile device 1426 may be removed. Similarly, the space created by the upper portion 1502 sliding away from the bottom portion 1506 allows the mobile device to be inserted into the battery pack 1402.

To make it easier to insert and/or remove the mobile device 1426 from the battery pack 1402, the guides 1504 may include hinge points that allow the upper portion 1502 to fold relative to the bottom portion 1506, thereby allowing the mobile device 1426 to be removed or inserted with greater ease.

Speakers & Microphone

Another feature may provide for one or more speakers to be included as part of the battery packs or holster (illustrated in FIGS. 1-18). For instance a low-profile speaker may be housed within the back plane of a battery pack so that the sound may be emitted from the rear or sides of the battery pack. When a mobile device is inserted and coupled to the battery pack, it couples to an interface that electrically connects the speaker to the mobile device. The mobile device may send audio or sound signals to the speaker via an interface with the battery pack. This allows a user to listen to audio stored in the mobile device without the need for headphones.

Similarly, another feature may provide for one or more microphones to be included as part of the battery packs (illustrated in FIGS. 1-18). One or more microphones may be housed within the battery pack (e.g., back plane) so that they may capture sound from a user. The microphone may be electrically coupled to an interface that allows sending captured audio signals to a mobile device that may be coupled to the battery pack.

Additional Features

In some embodiments the back plane of the battery packs and/or holster of FIGS. 1-18 may house additional devices.

For example, the rear of the back plane may house an additional display screen extend the screen on the mobile device. The additional display screen may be electrically coupled to the mobile device (via an interface) to allow the mobile device to send images or video to the additional display screen.

In another example, the rear of the back plane may house a Braille input and/or output interface that electrically coupled a mobile device mounted within the holster or battery pack.

In yet another embodiment, the rear of the back plane may provide a keypad that serves as an input to the mobile device.

According to another feature, the battery pack and/or holster may provide an external interface (e.g., Bluetooth wireless interface, USB port, infrared port, etc.) that may allow the mobile device mounted in the battery pack and/or holster to communicate via that external interface. Thus the external interface may provide a different wireless interface than provided or supported by the internal system of the mobile device.

One or more of the features illustrated in FIGS. 1-18 may be rearranged and/or combined into a single component or embodied in several components. Additional components may also be added without departing from the invention.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

The following is claimed:

1. A battery case for use with a mobile electronic device, the battery case comprising:
    a battery;
    a back wall configured to be positioned adjacent to at least a portion of a back side of a mobile electronic device;
    a bottom wall configured to be positioned adjacent to at least a portion of a bottom of the mobile electronic device;
    an upper wall configured to be positioned adjacent to at least a portion of a top of the mobile electronic device;
    a right side wall configured to be positioned adjacent to at least a portion of a right side of the mobile electronic device;
    a left side wall configured to be positioned adjacent to at least a portion of a left side of the mobile electronic device;
    a front opening configured such that a display of the mobile electronic device is visible through the front opening;
    a device interface configured to engage a corresponding interface on the mobile electronic device, wherein the battery is coupled to the device interface to provide electrical power to the mobile electronic device through the device interface, and wherein the device interface is configured to permit transfer of data to or from the mobile electronic device; and
    an external interface configured to recharge the battery, wherein the external interface is configured to enable the mobile electronic device to communicate with an external device;
    wherein the upper wall is flexible to facilitate insertion of the mobile electronic device into the battery case.

2. The battery case of claim 1, further comprising a charge indicator configured to indicate the charge status of the battery.

3. The battery case of claim 2, wherein the charge indicator is disposed on a back side of the back wall.

4. The battery case of claim 1, wherein the device interface extends from the bottom wall.

5. The battery case of claim 1, wherein the external interface comprises a USB port.

6. The battery case of claim 1, wherein the battery case is configured to receive a mobile phone.

7. The battery case of claim 6, wherein the battery case is shaped to conform to the external shape of the mobile phone without significantly affecting the usability of the mobile phone.

8. The battery case of claim 1, wherein the upper wall comprises an upper flange, wherein the upper flange is configured to flex to facilitate insertion of the mobile electronic device into the battery case.

9. The battery case of claim 1, wherein the battery case includes a single-piece casing.

10. The battery case of claim 1, wherein the battery is housed within a thickness of the back wall.

11. A battery case for use with a mobile electronic device, the battery case comprising:
    a back wall configured to extend across at least a portion of a back side of a mobile electronic device;
    a battery housed within a thickness of the back wall;
    a front opening configured such that a display of the mobile electronic device is visible through the front opening;
    a bottom wall configured to extend along at least a portion of a bottom of the mobile electronic device;
    a device interface extending from the bottom wall, the device interface configured to engage a corresponding interface on the mobile electronic device, wherein the battery is coupled to the device interface to provide electrical power to the mobile electronic device through the device interface; and
    an external interface configured to recharge the battery; and
    an upper wall configured to extend along at least a portion of a top of the mobile electronic device, wherein the upper wall is flexible to facilitate insertion of the mobile electronic device into the battery case.

12. The battery case of claim 11, further comprising a charge indicator configured to indicate the charge status of the battery.

13. The battery case of claim 12, wherein the charge indicator is disposed on a back side of the back wall.

14. The battery case of claim 11, wherein the device interface is configured to permit transfer of data to or from the mobile electronic device, and wherein the external interface is configured to enable the mobile electronic device to communicate with an external device.

15. The battery case of claim 11, wherein the battery case is configured to receive a mobile phone.

16. The battery case of claim 15, wherein the battery case is shaped to conform to the external shape of the mobile phone without significantly affecting the usability of the mobile phone.

17. The battery case of claim 11, wherein the upper wall comprises an upper flange, wherein the upper flange is configured to flex to facilitate insertion of the mobile electronic device into the battery case.

18. The battery case of claim 11, wherein the battery case includes a single-piece casing.

* * * * *